(12) United States Patent
You et al.

(10) Patent No.: US 11,901,357 B2
(45) Date of Patent: Feb. 13, 2024

(54) SEMICONDUCTOR DEVICE

(71) Applicant: SAMSUNG ELECTRONICS CO., LTD., Suwon-si (KR)

(72) Inventors: Junggun You, Ansan-si (KR); Sung Gi Hur, Hwaseong-si (KR); Sungil Park, Suwon-si (KR); Wooseok Park, Ansan-si (KR); Seungmin Song, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 282 days.

(21) Appl. No.: 17/380,232

(22) Filed: Jul. 20, 2021

(65) Prior Publication Data

US 2022/0157811 A1    May 19, 2022

(30) Foreign Application Priority Data

Nov. 18, 2020  (KR) ......................... 10-2020-0154293

(51) Int. Cl.
    *H01L 27/088* (2006.01)
(52) U.S. Cl.
    CPC .................. *H01L 27/088* (2013.01)
(58) Field of Classification Search
    CPC ............ H01L 27/088; H01L 29/42392; H01L 21/823807; H01L 29/42376; H01L 29/0673
    See application file for complete search history.

(56) References Cited

U.S. PATENT DOCUMENTS

| | | | |
|---|---|---|---|
| 8,569,842 B2 | 10/2013 | Weis et al. | |
| 8,629,478 B2 | 1/2014 | Ko et al. | |
| 9,076,537 B2 | 7/2015 | Khvalkovskiy et al. | |
| 9,105,830 B2 | 8/2015 | Khvalkovskiy et al. | |
| 9,515,025 B2 | 12/2016 | Rogers et al. | |
| 9,768,305 B2 | 9/2017 | Ko et al. | |
| 10,297,667 B1 | 5/2019 | Yeung et al. | |
| 10,504,900 B2 | 12/2019 | Hashemi et al. | |
| 2017/0170269 A1* | 6/2017 | Balakrishnan | H01L 29/42356 |
| 2018/0158927 A1 | 6/2018 | Mohapatra et al. | |
| 2019/0378911 A1 | 12/2019 | Lee et al. | |

(Continued)

FOREIGN PATENT DOCUMENTS

| | | |
|---|---|---|
| KR | 10-2018-0021146 A | 2/2018 |
| KR | 10-2019-0140564 A | 12/2019 |

*Primary Examiner* — Changhyun Yi
(74) *Attorney, Agent, or Firm* — Muir Patent Law, PLLC

(57) ABSTRACT

A semiconductor device including a substrate that includes first and second regions; a first active pattern on the first region, the first active pattern including first source/drain patterns and a first channel pattern between the first source/drain patterns; a second active pattern on the second region, the second active pattern including second source/drain patterns and a second channel pattern between the second source/drain patterns; and a first gate electrode on the first channel pattern and a second gate electrode on the second channel pattern, wherein a length of the first channel pattern is greater than a length of the second channel pattern, each of the first channel pattern and the second channel pattern includes a plurality of semiconductor patterns stacked on the substrate, and at least two semiconductor patterns of the first channel pattern are bent away from or toward a bottom surface of the substrate.

19 Claims, 44 Drawing Sheets

(56) References Cited

U.S. PATENT DOCUMENTS

| | | | |
|---|---|---|---|
| 2020/0066839 A1* | 2/2020 | Zhang | H01L 21/823412 |
| 2020/0075574 A1* | 3/2020 | Smith | H01L 29/0692 |
| 2020/0105929 A1 | 4/2020 | Zhang et al. | |
| 2020/0168715 A1 | 5/2020 | Wu et al. | |
| 2020/0185228 A1 | 6/2020 | Sung et al. | |

* cited by examiner

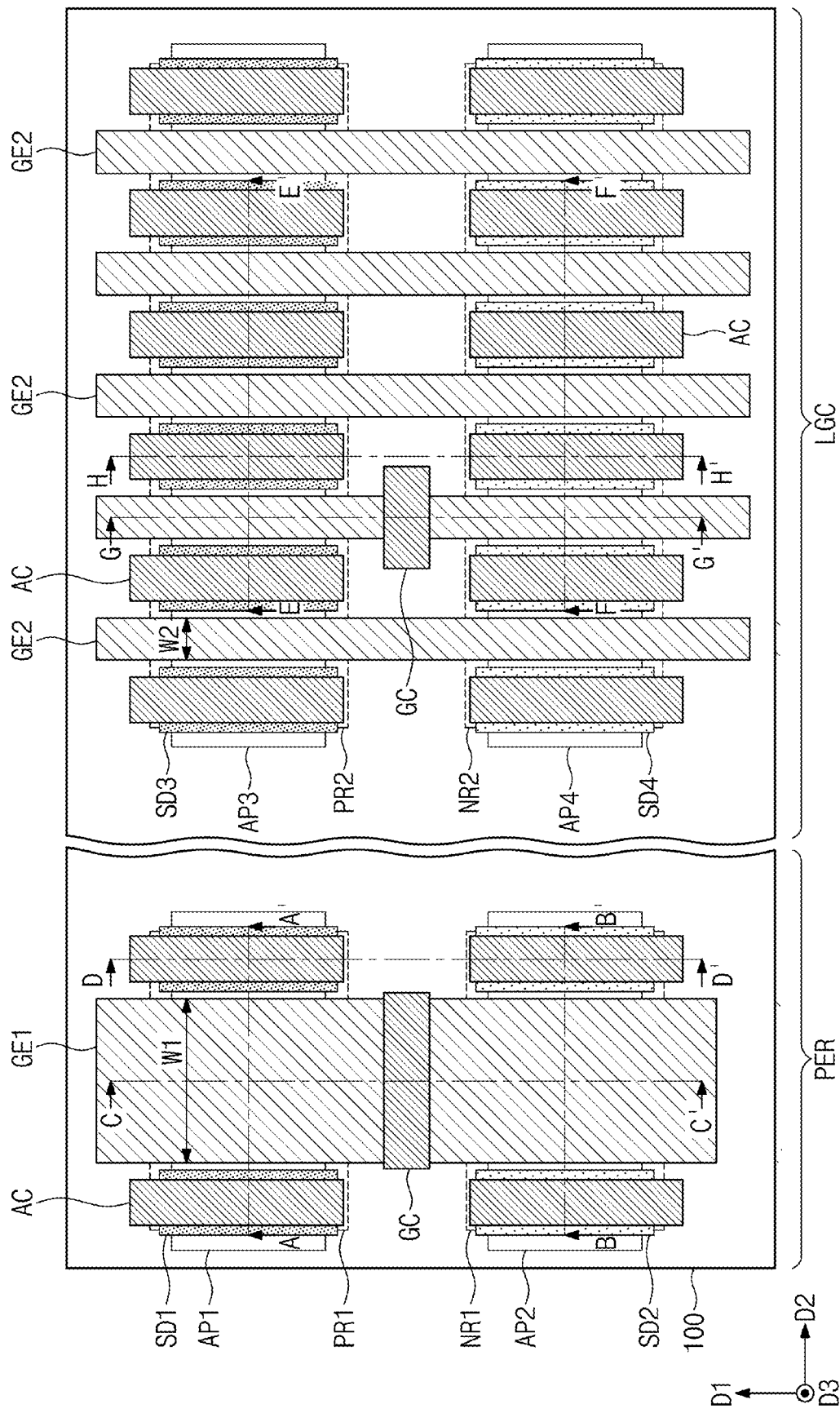

SEMICONDUCTOR DEVICE

CROSS-REFERENCE TO RELATED APPLICATION

Korean Patent Application No. 10-2020-0154293 filed on Nov. 18, 2020 in the Korean Intellectual Property Office, and entitled: "Semiconductor Device," is incorporated by reference herein in its entirety.

BACKGROUND

1. Field

Embodiments relate to a semiconductor device.

2. Description of the Related Art

A semiconductor device may include an integrated circuit including metal oxide semiconductor field effect transistors (MOSFETs). As sizes and design rules of the semiconductor device are gradually decreased, sizes of the MOSFETs are also increasingly scaled down.

SUMMARY

The embodiments may be realized by providing a semiconductor device including a substrate that includes a first region and a second region; a first active pattern on the first region, the first active pattern including a pair of first source/drain patterns and a first channel pattern between the pair of first source/drain patterns; a second active pattern on the second region, the second active pattern including a pair of second source/drain patterns and a second channel pattern between the pair of second source/drain patterns; and a first gate electrode on the first channel pattern and a second gate electrode on the second channel pattern, wherein a length of the first channel pattern is greater than a length of the second channel pattern, each of the first channel pattern and the second channel pattern includes a plurality of semiconductor patterns stacked on the substrate, and at least two semiconductor patterns of the plurality of semiconductor patterns of the first channel pattern are bent in a first vertical direction away from a bottom surface of the substrate or bent in a second vertical direction toward the bottom surface of the substrate.

The embodiments may be realized by providing a semiconductor device including a substrate that includes a first region and a second region; a first active pattern on the first region, the first active pattern including a pair of first source/drain patterns and a first channel pattern between the pair of first source/drain patterns; a second active pattern on the second region, the second active pattern including a pair of second source/drain patterns and a second channel pattern between the pair of second source/drain patterns; and a first gate electrode on the first channel pattern and a second gate electrode on the second channel pattern, wherein a length of the first channel pattern is greater than a length of the second channel pattern, the first channel pattern includes a first semiconductor pattern, a second semiconductor pattern, and a third semiconductor pattern sequentially stacked on the substrate, the first gate electrode includes a first part between the substrate and the first semiconductor pattern; a second part between the first semiconductor pattern and the second semiconductor pattern; and a third part between the second semiconductor pattern and the third semiconductor pattern, a thickness of one of the second part and the third part decreases from a center point thereof to an edge point thereof, and a thickness of another of the second part and the third part increases from a center point thereof to an edge point thereof.

The embodiments may be realized by providing a semiconductor device including a substrate that includes a peripheral region and a logic cell region; a device isolation layer that defines a first active pattern on the peripheral region and a second active pattern on the logic cell region; a pair of first source/drain patterns on the first active pattern and a pair of second source/drain patterns on the second active pattern; a first channel pattern between the pair of first source/drain patterns and a second channel pattern between the pair of second source/drain patterns, each of the first channel pattern and the second channel pattern including a first semiconductor pattern, a second semiconductor pattern, and a third semiconductor pattern sequentially stacked on the substrate; a first gate electrode on the first channel pattern and a second gate electrode on the second channel pattern; a first gate dielectric layer between the first channel pattern and the first gate electrode and a second gate dielectric layer between the second channel pattern and the second gate electrode; a pair of gate spacers on opposite sides of each of the first gate electrode and the second gate electrode; a gate capping pattern on a top surface of each of the first gate electrode and the second gate electrode; a plurality of active contacts electrically connected to the first source/drain pattern and the second source/drain pattern; a plurality of gate contacts electrically connected to the first gate electrode and the second gate electrode; a first metal layer on the active contacts and the gate contacts, the first metal layer including a plurality of first lines electrically connected to the active contacts and the gate contacts; and a second metal layer on the first metal layer, wherein a length of the first channel pattern is greater than a length of the second channel pattern, and at least two of the first semiconductor pattern, the second semiconductor pattern, and the third semiconductor pattern of the first channel pattern are bent in a first vertical direction away from a bottom surface of the substrate or bent in a second vertical direction toward the bottom surface of the substrate.

BRIEF DESCRIPTION OF THE DRAWINGS

Features will be apparent to those of skill in the art by describing in detail exemplary embodiments with reference to the attached drawings in which:

FIG. 1 illustrates a plan view of a semiconductor device according to some example embodiments.

DETAILED DESCRIPTION

Figure 2A:
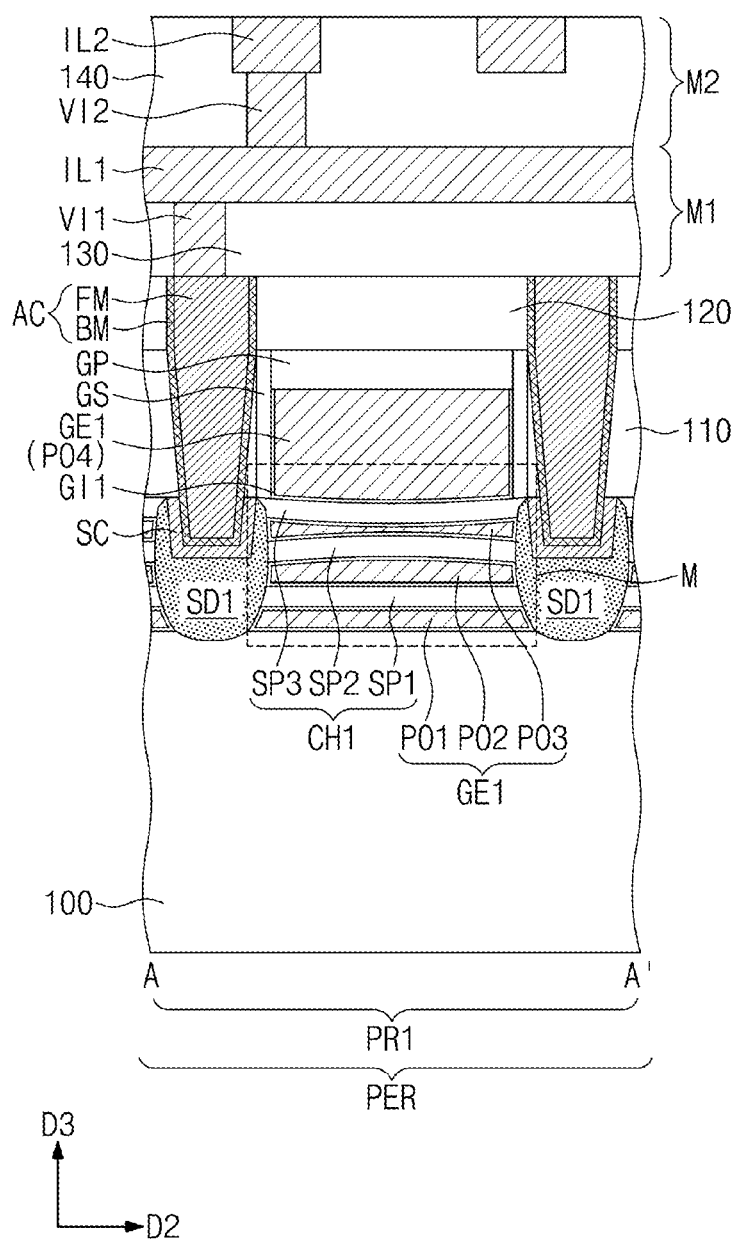
FIGS. 2A, 2B, 2C, 2D, 2E, 2F, 2G, and 2H illustrate cross-sectional views respectively taken along lines A-A', B-B', C-C', D-D', E-E', F-F', G-G', and H-H' of FIG. 1.
Figure 2B:
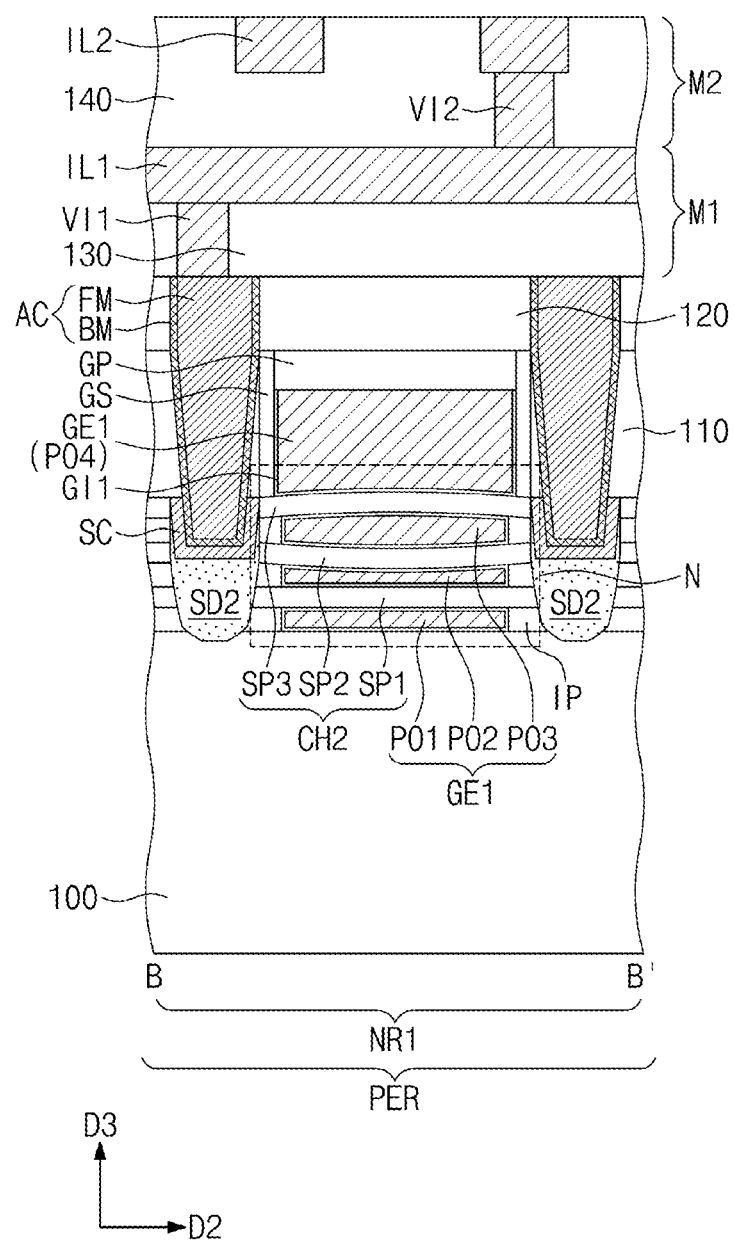

FIG. 1 illustrates a plan view of a semiconductor device according to some example embodiments. FIGS. 2A, 2B, 2C, 2D, 2E, 2F, 2G, and 2H illustrate cross-sectional views respectively taken along lines A-A', B-B', C-C', D-D', E-E', F-F', G-G', and H-H' of FIG. 1.

Referring to FIG. 1, a substrate 100 may be provided that includes a peripheral region PER and a logic cell region LGC. The substrate 100 may be a compound semiconductor substrate or a semiconductor substrate including silicon, germanium, or silicon-germanium. In an implementation, the substrate 100 may be a silicon substrate. The peripheral region PER may be an area including transistors that constitute either a process core or an input/out terminal. The logic cell region LGC may be an area including a standard cell that constitutes a logic circuit. The peripheral region PER may include a long-gate transistor whose gate length (or channel length) is relatively large. A transistor on the peripheral region PER may operate at higher power than that required for operating a transistor on the logic cell region LGC. A transistor on the peripheral region PER will be first described in detail with reference to FIGS. 1 and 2A to 2D.

The peripheral region PER may include a first PMOSFET region PR1 and a first NMOSFET region NR1. The first PMOSFET region PR1 and the first NMOSFET region NR1 may be defined by a second trench TR2 on or in an upper portion of the substrate 100. In an implementation, the second trench TR2 may be between the first PMOSFET region PR1 and the first NMOSFET region NR1. The first PMOSFET region PR1 and the first NMOSFET region NR1 may be spaced apart from each other in a first direction D1 across the second trench TR2.

A first trench TR1 on the upper portion of the substrate 100 may define a first active pattern AP1 and a second active pattern AP2. The first active pattern AP1 and the second active pattern AP2 may be respectively on the first PMOSFET region PR1 and the first NMOSFET region NR1. The first trench TR1 may be shallower than the second trench TR2. The first and second active patterns AP1 and AP2 may extend in a second direction D2. The first and second active patterns AP1 and AP2 may be vertically protruding portions of the substrate 100.

A device isolation layer ST may fill the first and second trenches TR1 and TR2. The device isolation layer ST may include a silicon oxide layer. The first and second active patterns AP1 and AP2 may have upper portions that vertically protrude upwardly from the device isolation layer ST (see FIG. 2C). The device isolation layer ST may cover none of the upper portions of the first and second active patterns AP1 and AP2. The device isolation layer ST may cover lower sidewalls of the first and second active patterns AP1 and AP2.

The first active pattern AP1 may include a first channel pattern CH1 on the upper portion thereof. The second active pattern AP2 may include a second channel pattern CH2 on the upper portion thereof. Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in a vertical direction, e.g., a third direction D3.

Each of the first, second, and third semiconductor patterns SP1, SP2, and SP3 may include silicon (Si), germanium (Ge), or silicon-germanium (SiGe). In an implementation, each of the first, second, and third semiconductor patterns SP1, SP2, and SP3 may include crystalline silicon. As used herein, the term "or" is not an exclusive term, e.g., "A or B" would include A, B, or A and B A pair of first source/drain patterns SD1 may be on the upper portion of the first active pattern AP1. The first source/drain patterns SD1 may be impurity regions having a first conductivity type (e.g., p-type). The first, second, and third semiconductor patterns SP1, SP2, and SP3 of the first channel pattern CH1 may be between the pair of first source/drain patterns SD1. In an implementation, the first, second, and third semiconductor patterns SP1, SP2, and SP3 of the first channel pattern CH1 may connect the pair of first source/drain patterns SD1 to each other.

A pair of second source/drain patterns SD2 may be on the upper portion of the second active pattern AP2. The second source/drain patterns SD2 may be impurity regions having a second conductivity type (e.g., n-type). The first, second, and third semiconductor patterns SP1, SP2, and SP3 of the second channel pattern CH2 may be between the pair of second source/drain patterns SD2. In an implementation, the first, second, and third semiconductor patterns SP1, SP2, and SP3 of the second channel pattern CH2 may connect the pair of second source/drain patterns SD2 to each other.

The first and second source/drain patterns SD1 and SD2 may be epitaxial patterns formed by a selective epitaxial growth process. In an implementation, the first and second source/drain patterns SD1 and SD2 may have top surfaces at a level substantially the same as that of a top surface of the third semiconductor pattern SP3. In an implementation, one or more of the first and second source/drain patterns SD1 and SD2 may have a top surface higher than that of the third semiconductor pattern SP3 adjacent thereto.

The first source/drain patterns SD1 may include a semiconductor element (e.g., SiGe) whose lattice constant is greater than that of a semiconductor element of the substrate 100. Therefore, the first source/drain patterns SD1 may provide the first channel pattern CH1 with compressive stress.

In an implementation, the second source/drain patterns SD2 may include the same semiconductor element (e.g., Si) as that of the substrate 100. In an implementation, the second source/drain patterns SD2 may include not only silicon (Si) but also carbon (C). In an implementation, the second source/drain patterns SD2 may include silicon carbide (SiC). In an implementation, when the second source/drain pattern SD2 includes silicon carbide (SiC), the second source/drain pattern SD2 may have a carbon concentration of about 10 at % to about 30 at %. A pair of second source/drain patterns SD2 including silicon carbide (SiC) may provide the second channel pattern CH2 therebetween with tensile stress.

A first gate electrode GE1 may extend (e.g., lengthwise) in the first direction D1, while running across the first and second active patterns AP1 and AP2. The first gate electrode GE1 may extend from the first PMOSFET region PR1 toward the first NMOSFET region NR1. The first gate electrode GE1 may vertically overlap the first and second channel patterns CH1 and CH2.

The first gate electrode GE1 may include a first part P01 between the substrate 100 and the first semiconductor pattern SP1, a second part P02 between the first semiconductor pattern SP1 and the second semiconductor pattern SP2, a third part P03 between the second semiconductor pattern SP2 and the third semiconductor pattern SP3, and a fourth part P04 on the third semiconductor pattern SP3.

Referring back to FIG. 2C, the first gate electrode GE1 may be on a top surface TOS, a bottom surface BOS, and opposite sidewalls SIW of each of the first, second, and third semiconductor patterns SP1, SP2, and SP3. In an implementation, a transistor on the peripheral region PER according to the present embodiment may be a three-dimensional field effect transistor (e.g., MBCFET or GAAFET) in which a gate electrode surrounds a channel three-dimensionally.

Referring back to FIGS. 1 and 2A to 2D, a pair of gate spacers GS may be on opposite sidewalls of the first gate electrode GE1. The gate spacers GS may extend (e.g., lengthwise) in the first direction D1 along the first gate electrode GE1. The gate spacers GS may have top surfaces higher than (e.g., farther from the substrate 100 in the third direction D3 than) that of the first gate electrode GE1. The top surfaces of the gate spacers GS may be coplanar with that of a first interlayer dielectric layer 110 which will be discussed below. The gate spacers GS may include SiCN, SiCON, or SiN. In an implementation, the gate spacers GS may each include a multi-layer formed of at least two of SiCN, SiCON, and SiN.

A gate capping pattern GP may be on the first gate electrode GE1. The gate capping pattern GP may extend (e.g., lengthwise) in the first direction D1 along the first gate electrode GE1. The gate capping pattern GP may include a material having an etch selectivity with respect to first and second interlayer dielectric layers 110 and 120 which will be discussed below. In an implementation, the gate capping pattern GP may include SiON, SiCN, SiCON, or SiN.

A first gate dielectric layer GI1 may be between the first gate electrode GE1 and the first channel pattern CH1 and between the first gate electrode GE1 and the second channel pattern CH2. The first gate dielectric layer GI1 may directly cover the top surface TOS, the bottom surface BOS, and the opposite sidewalls SIW of each of the first, second, and third semiconductor patterns SP1, SP2, and SP3. The first gate dielectric layer GI1 may extend along a bottom surface of the first gate electrode GE1 above the first gate dielectric layer GI1. The first gate dielectric layer GI1 may cover a top surface of the device isolation layer ST below the first gate electrode GE1.

In an implementation, the first gate dielectric layer GI1 may include a silicon oxide layer, a silicon oxynitride layer, or a high-k dielectric layer. The high-k dielectric layer may include a material whose dielectric constant is greater than that of a silicon oxide layer. In an implementation, the high-k dielectric material may include hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

A semiconductor device according to some example embodiments may include a negative capacitance field effect transistor that uses a negative capacitor. In an implementation, the first gate dielectric layer GI1 may include a ferroelectric material layer having ferroelectric properties and a paraelectric material layer having paraelectric properties.

The ferroelectric material layer may have a negative capacitance, and the paraelectric material layer may have a positive capacitance. In an implementation, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a subthreshold swing of less than about 60 mV/decade at room temperature.

The ferroelectric material layer may have ferroelectric properties. The ferroelectric material layer may include, e.g., hafnium oxide, hafnium zirconium oxide, barium strontium titanium oxide, or lead zirconium titanium oxide. In an implementation, the hafnium zirconium oxide may be a material in which hafnium oxide is doped with zirconium (Zr). In an implementation, the hafnium zirconium oxide may be a compound of hafnium (Hf), zirconium (Zr), and oxygen (O).

The ferroelectric material layer may further include impurities doped thereinto. In an implementation, the impurities may include aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). A kind of impurities included in the ferroelectric material layer may be changed depending on what ferroelectric material is included in the ferroelectric material layer.

When the ferroelectric material layer includes hafnium oxide, the ferroelectric material layer may include an impurity, e.g., gadolinium (Gd), silicon (Si), zirconium (Zr), aluminum (Al), or yttrium (Y).

When the impurities are aluminum (Al), the ferroelectric material layer may include about 3 to 8 at % aluminum. In this description, the at % of impurities may be a percent of atoms of impurity (e.g., aluminum) to the sum of atoms of hafnium and the impurity (e.g., aluminum).

When the impurities are silicon (Si), the ferroelectric material layer may include about 2 to 10 at % silicon. When the impurities are yttrium (Y), the ferroelectric material layer may include about 2 to 10 at % yttrium. When the impurities are gadolinium (Gd), the ferroelectric material layer may include about 1 to 7 at % gadolinium. When the impurities are zirconium (Zr), the ferroelectric material layer may include about 50 to 80 at % zirconium.

The paraelectric material layer may have paraelectric properties. The paraelectric material layer may include, e.g., silicon oxide or a high-k metal oxide. The metal oxide included in the paraelectric material layer may include, e.g., hafnium oxide, zirconium oxide, or aluminum oxide.

The ferroelectric and paraelectric material layers may include the same material. The ferroelectric material layer may have ferroelectric properties, and the paraelectric material layer may not have ferroelectric properties. In an implementation, when the ferroelectric material layer and the paraelectric material layer include hafnium oxide, the hafnium oxide included in the ferroelectric material layer may have a different crystal structure from that of the hafnium oxide included in the paraelectric material layer.

The ferroelectric material layer may have a thickness having ferroelectric properties. The thickness of the ferroelectric material layer may range, e.g., from about 0.5 nm to about 10 nm. Ferroelectric materials have their own critical thickness that exhibits ferroelectric properties, and the thickness of the ferroelectric material layer may depend on ferroelectric material.

In an implementation, the first gate dielectric layer GI1 may include one ferroelectric material layer. In an implementation, the first gate dielectric layer GI1 may include a plurality of ferroelectric material layers that are spaced apart from each other. In an implementation, the first gate dielectric layer GI1 may have a stack-layered structure in which a plurality of ferroelectric material layers are stacked alternately with a plurality of paraelectric material layers.

The first gate electrode GE1 may include a first metal pattern and a second metal pattern on the first metal pattern. The first gate dielectric layer GI1 may include the first metal pattern adjacent to the first and second channel patterns CH1 and CH2. The first metal pattern may include a work-function metal that helps control a threshold voltage of a transistor. A thickness and composition of the first metal pattern may be adjusted to achieve a desired threshold voltage of a transistor.

The first metal pattern may include a metal nitride layer. In an implementation, the first metal pattern may include nitrogen (N) and, e.g., titanium (Ti), tantalum (Ta), aluminum (Al), tungsten (W), or molybdenum (Mo). In an implementation, the first metal pattern may further include carbon (C). The first metal pattern may include a plurality of stacked work-function metal layers.

The second metal pattern may include metal whose resistance is less than that of the first metal pattern. In an implementation, the second metal pattern may include tungsten (W), aluminum (Al), titanium (Ti), or tantalum (Ta).

Referring back to FIG. 2B, inner spacers IP may be on the first NMOSFET region NR1. The inner spacers IP may be correspondingly between the second source/drain pattern SD2 and the first, second, and third parts P01, P02, and P03 of the first gate electrode GE1. The inner spacers IP may be in direct contact with the second source/drain pattern SD2. The inner spacer IP may space each of the first, second, and third parts P01, P02, and P03 of the first gate electrode GE1 apart from the second source/drain pattern SD2.

The inner spacer IP may include a low-k dielectric material. The low-k dielectric material may include a material whose dielectric constant is less than that of silicon oxide or silicon nitride. In an implementation, the low-k dielectric material may include silicon oxide, silicon oxide doped with fluorine or carbon, porous silicon oxide, or an organic polymeric dielectric.

A first interlayer dielectric layer 110 may be on the substrate 100. The first interlayer dielectric layer 110 may cover the gate spacers GS and the first and second source/drain patterns SD1 and SD2. The first interlayer dielectric layer 110 may have a top surface (e.g., surface facing away from the substrate 100 in the third direction D3) that is substantially coplanar with that of the gate capping pattern GP and those of the gate spacers GS. The first interlayer dielectric layer 110 may include a second interlayer dielectric layer 120 thereon that covers the gate capping pattern GP. In an implementation, the first and second interlayer dielectric layers 110 and 120 may include a silicon oxide layer.

Active contacts AC may penetrate the first and second interlayer dielectric layers 110 and 120 and may correspondingly have an electrical connection with the first and second source/drain patterns SD1 and SD2. A pair of active contacts AC may be on opposite sides of the first gate electrode GE1. When viewed in a plan view, the active contact AC may have a bar shape that extends in the first direction D1.

The active contact AC may include a conductive pattern FM and a barrier pattern BM that surrounds the conductive pattern FM. In an implementation, the conductive pattern FM may include a metal, e.g., aluminum, copper, tungsten, molybdenum, or cobalt. The barrier pattern BM may cover sidewalls and a bottom surface of the conductive pattern FM. The barrier pattern BM may include a metal layer and a metal nitride layer. The metal layer may include titanium, tantalum, tungsten, nickel, cobalt, or platinum. The metal nitride layer may include a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer.

The active contact AC may be a self-aligned contact. In an implementation, the gate capping pattern GP and the gate spacer GS may be used to form the active contact AC in a self-aligned manner. In an implementation, the active contact AC may cover at least a portion of a sidewall of the gate spacer GS. In an implementation, the active contact AC may partially cover a portion of the top surface of the gate capping pattern GP.

A silicide pattern SC may be between the active contact AC and the first source/drain pattern SD1 and between the active contact AC and the second source/drain pattern SD2. The active contact AC may be electrically connected through the silicide pattern SC to one of the first and second source/drain patterns SD1 and SD2. The silicide pattern SC may include a metal silicide, e.g., titanium silicide, tantalum silicide, tungsten silicide, nickel silicide, or cobalt silicide.

A gate contact GC may penetrate the second interlayer dielectric layer 120 and the gate capping pattern GP and to have an electrical connection with the first gate electrode GE1. The gate contact GC may be on the device isolation layer ST between the first PMOSFET region PR1 and the first NMOSFET region NR1. When viewed in plan, the gate contact GC may have a bar shape that extends (e.g., lengthwise) in the second direction D2. Like the active contact AC, the gate contact GC may include a conductive pattern FM and a barrier pattern BM that surrounds the conductive pattern FM.

A third interlayer dielectric layer 130 may be on the second interlayer dielectric layer 120. A first metal layer M1 may be in the third interlayer dielectric layer 130. The first metal layer M1 may include first lines IL1 and first vias VI1. The first vias VI1 may be below the first lines IL1. The first lines IL1 may be along the first direction D1. Each of the first lines IL1 may have a linear or bar shape that extends in the second direction D2.

The first vias VI1 may be correspondingly below the first lines IL1 of the first metal layer M1. The first vias VI1 may be correspondingly between the active contacts AC and the first lines IL1. The first vias VI1 may be correspondingly between the gate contacts GC and the first lines IL1.

The first line IL1 and its underlying first via VI1 of the first metal layer M1 may be formed by separate processes from each other. In an implementation, each of the first line IL1 and the first via VI1 may be formed by a single damascene process. A sub-20 nm process may be employed to fabricate a semiconductor device according to some example embodiments.

A fourth interlayer dielectric layer 140 may be on the third interlayer dielectric layer 130. A second metal layer M2 may be in the fourth interlayer dielectric layer 140. The second metal layer M2 may include second lines IL2. Each of the second lines IL2 may have a linear or bar shape that extends in the first direction D1. In an implementation, the second lines IL2 may extend in the second direction D2.

The second metal layer M2 may further include second vias VI2. The second vias VI2 may be correspondingly below the second lines IL2. The second vias VI2 may be correspondingly between the first line IL1 and the second lines IL2.

The second line IL2 and its underlying second via VI2 may be formed as a single piece in the same process. In an implementation, a dual damascene process may be employed to simultaneously form the second line IL2 and the second via VI2 of the second metal layer M2.

The first lines IL1 of the first metal layer M1 may include a conductive material the same as or different from that of the second lines IL2 of the second metal layer M2. In an implementation, the first and second lines IL1 and IL2 may include a metal, e.g., copper (Cu), ruthenium (Rh), cobalt (Co), tungsten (W), aluminum (Al), or molybdenum (Mo).

In an implementation, additional metal layers may be stacked on the fourth interlayer dielectric layer 140. Each of the stacked metal layers may include routing lines.

A transistor on the logic cell region LGC will be described in detail below with reference to FIGS. 1 and 2E to 2H. Omission may be made to avoid repetitive descriptions of technical features the same as or similar to those of the transistor on the peripheral region PER discussed with reference to FIGS. 1 and 2A to 2D, and differences thereof will be discussed in detail.

The logic cell region LGC may include a second PMOSFET region PR2 and a second NMOSFET region NR2. The second PMOSFET region PR2 and the second NMOSFET region NR2 may be defined by a fourth trench TR4 on the upper portion of the substrate 100. A third active pattern AP3 and a fourth active pattern AP4 may be defined by a third trench TR3 formed on the upper portion of the substrate 100. The third active pattern AP3 and the fourth active pattern AP4 may be respectively on the second PMOSFET region PR2 and the second NMOSFET region NR2.

The third active pattern AP3 may include a third channel pattern CH3 on an upper portion thereof, and the fourth active pattern AP4 may include a fourth channel pattern CH4 on an upper portion thereof. Each of the third and fourth channel patterns CH3 and CH4 may include first, second, and third semiconductor patterns SP1, SP2, and SP3 that are sequentially stacked.

The first, second, and third semiconductor patterns SP1, SP2, and SP3 of the third and fourth channel patterns CH3 and CH4 may be shorter than the first, second, and third semiconductor patterns SP1, SP2, and SP3 of the first and second channel patterns CH1 and CH2 discussed above. In an implementation, each of the first, second, and third semiconductor patterns SP1, SP2, and SP3 of the third and fourth channel patterns CH3 and CH4 may have a length in the second direction D2 less than a length in the second direction D2 of each of the first, second, and third semiconductor patterns SP1, SP2, and SP3 of the first and second channel patterns CH1 and CH2. In an implementation, the logic cell region LGC may include a short-gate transistor whose gate length (or channel length) is relatively small.

Third source/drain patterns SD3 may be on the upper portion of the third active pattern AP3. Fourth source/drain patterns SD4 may be on the upper portion of the fourth active pattern AP4. The first, second, and third semiconductor patterns SP1, SP2, and SP3 of the third channel pattern CH3 may be between a pair of third source/drain patterns SD3. The first, second, and third semiconductor patterns SP1, SP2, and SP3 of the fourth channel pattern CH4 may be between a pair of fourth source/drain patterns SD4.

Each of the third source/drain patterns SD3 may be an epitaxial pattern that contains impurities having a first conductivity type (e.g., p-type). Each of the fourth source/drain patterns SD4 may be an epitaxial pattern that contains impurities having a second conductivity type (e.g., n-type).

Second gate electrodes GE2 may extend in the first direction D1, while running across the third and fourth channel patterns CH3 and CH4. The second gate electrode GE2 may extend from the second PMOSFET region PR2 toward the second NMOSFET region NR2. The second gate electrode GE2 may vertically overlap the third and fourth channel patterns CH3 and CH4. A pair of gate spacers GS may be on opposite sidewalls of the second gate electrode GE2. A gate capping pattern GP may be on the second gate electrode GE2.

Referring back to FIG. 2G, the second gate electrode GE2 may be on a top surface, a bottom surface, and opposite sidewalls of each of the first, second, and third semiconductor patterns SP1, SP2, and SP3. In an implementation, a transistor on the logic cell region LGC may be a three-dimensional field effect transistor (e.g., MBCFET or GAAFET) in which a gate electrode surrounds a channel three-dimensionally.

Referring back to FIGS. 1 and 2E to 2H, a second gate dielectric layer GI2 may be between the second gate electrode GE2 and the third channel pattern CH3 and between the second gate electrode GE2 and the fourth channel pattern CH4. The second gate dielectric layer GI2 may include aa silicon oxide layer, a silicon nitride layer, or a high-k dielectric layer. In an implementation, the second gate dielectric layer GI2 on the logic cell region LGC may have a thickness less than that of the first gate dielectric layer GI1 on the peripheral region PER.

The second NMOSFET region NR2 may include inner spacers IP thereon. The inner spacers IP may be correspondingly between the fourth source/drain pattern SD4 and first, second, and third parts P01, P02, and P03 of the second gate electrode GE2. In an implementation, the inner spacers IP may be omitted from the second PMOSFET region PR2.

A first interlayer dielectric layer 110 and a second interlayer dielectric layer 120 may be on an entire surface of the substrate 100. Active contacts AC may penetrate the first and second interlayer dielectric layers 110 and 120 and may be connected with the third and fourth source/drain patterns SD3 and SD4. A gate contact GC may penetrate the second interlayer dielectric layer 120 and the gate capping pattern GP and may be electrically connected with the second gate electrode GE2. A first metal layer M1 and a second metal layer M2 may be on the second interlayer dielectric layer 120. The detailed descriptions of the active contacts AC, the gate contact GC, the first metal layer M1, and the second metal layer M2 may be substantially the same as those discussed with reference to FIGS. 1 and 2A to 2D.

The following will further discuss in detail the first, second, and third semiconductor patterns SP1, SP2, and SP3 of the first channel pattern CH1 on the peripheral region PER mentioned above. FIG. 3 illustrates an enlarged cross-sectional view of section M of FIG. 2A.

Figure 2C:
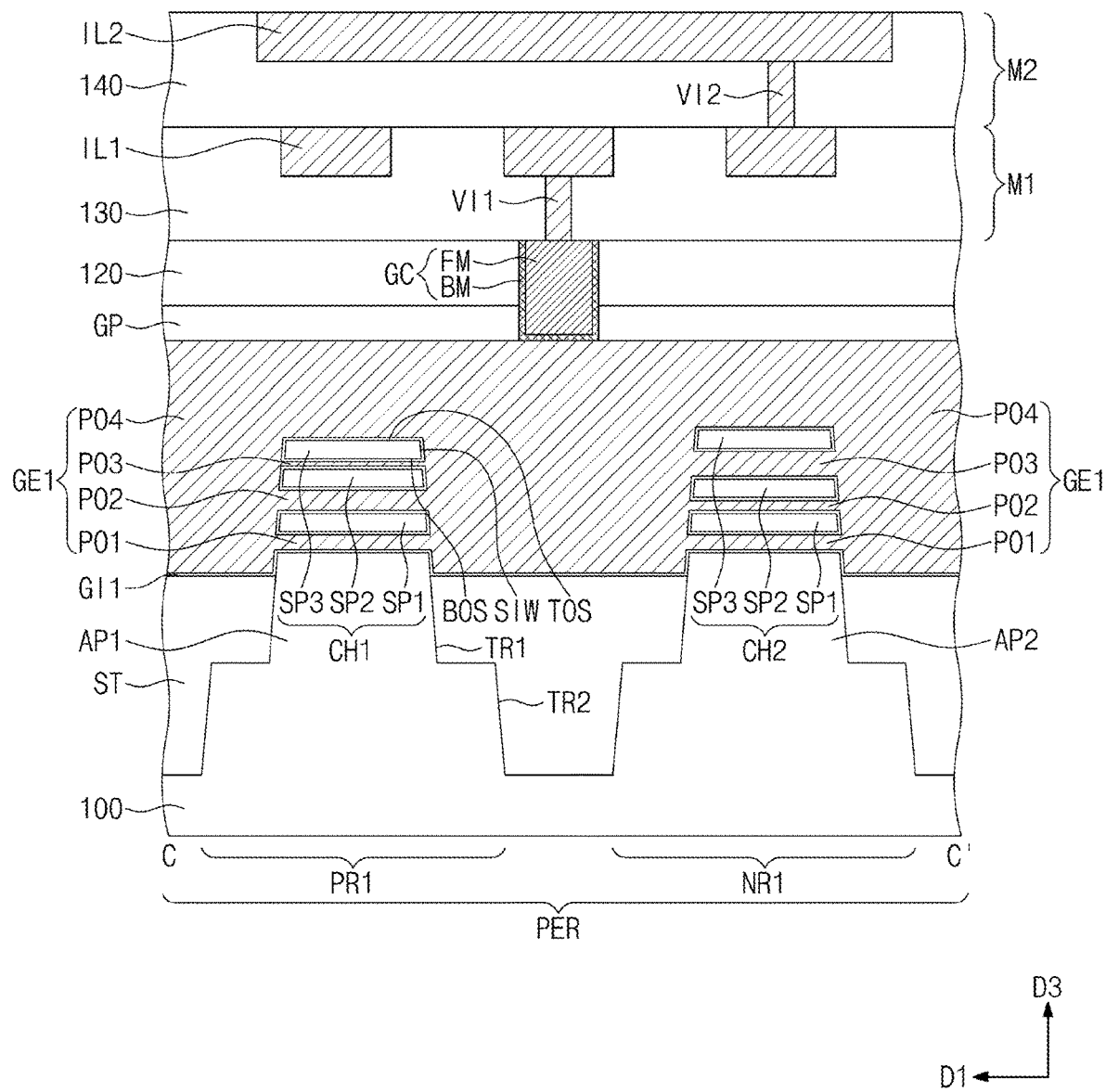
Figure 2D:
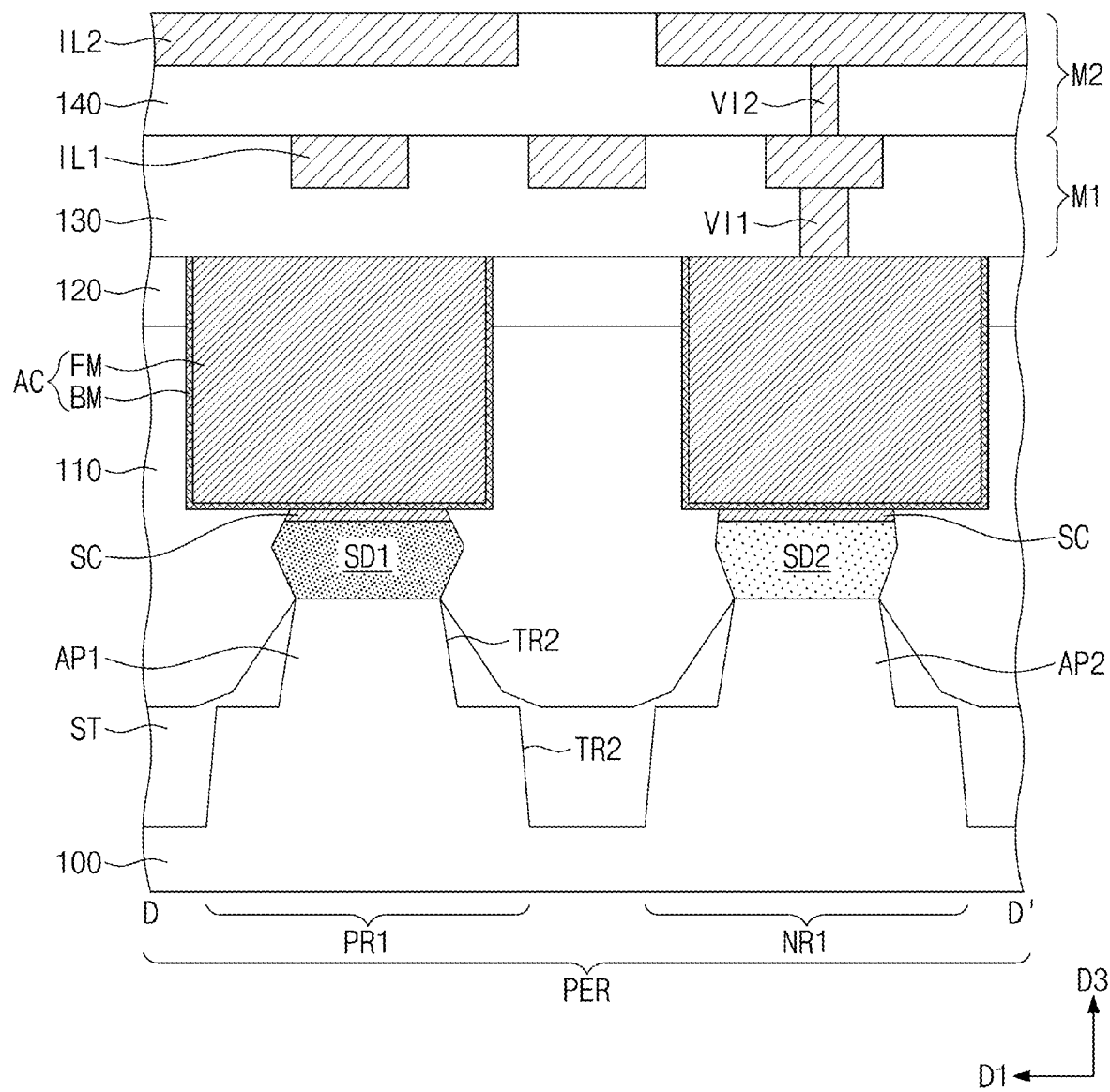
Figure 2E:
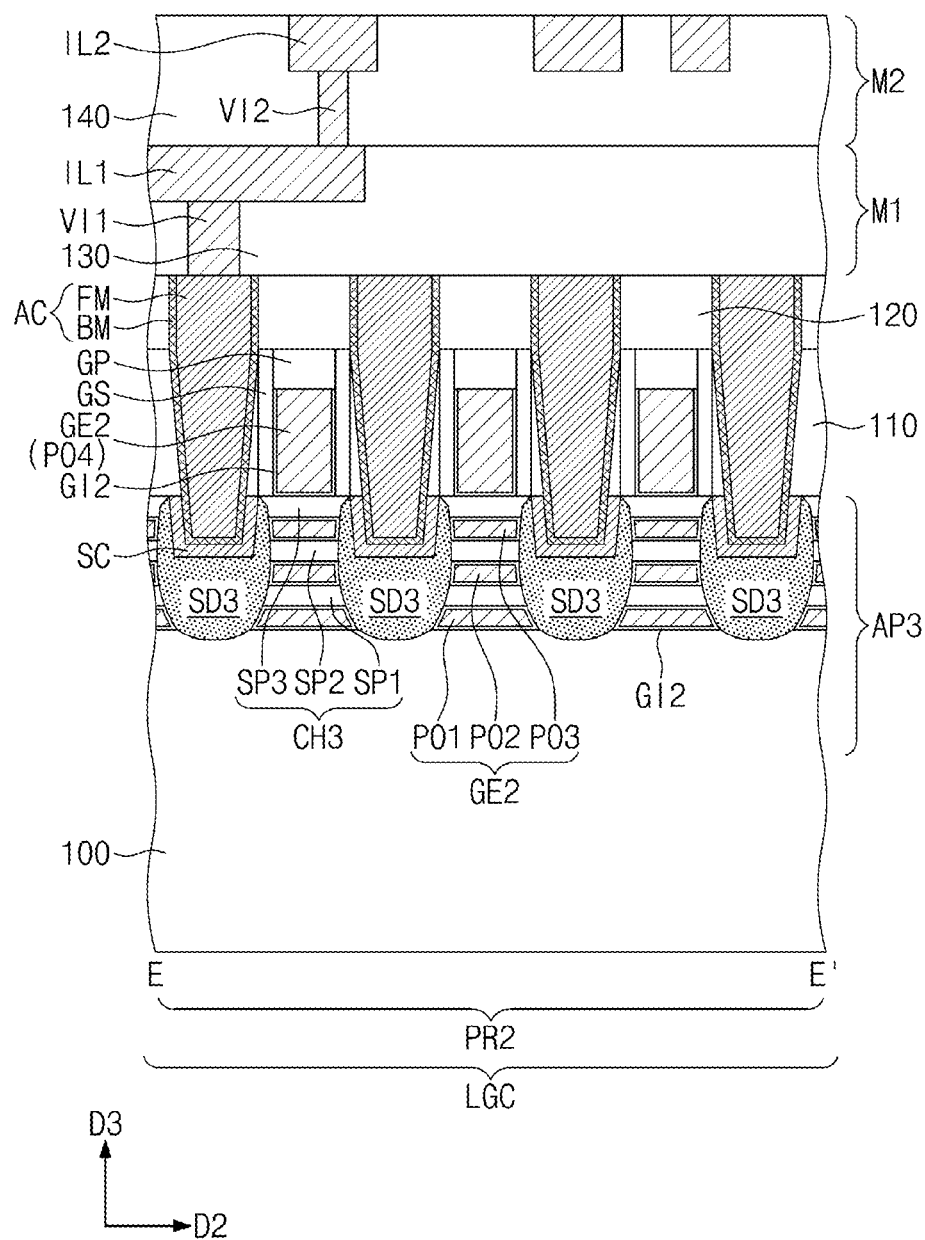
Figure 2F:
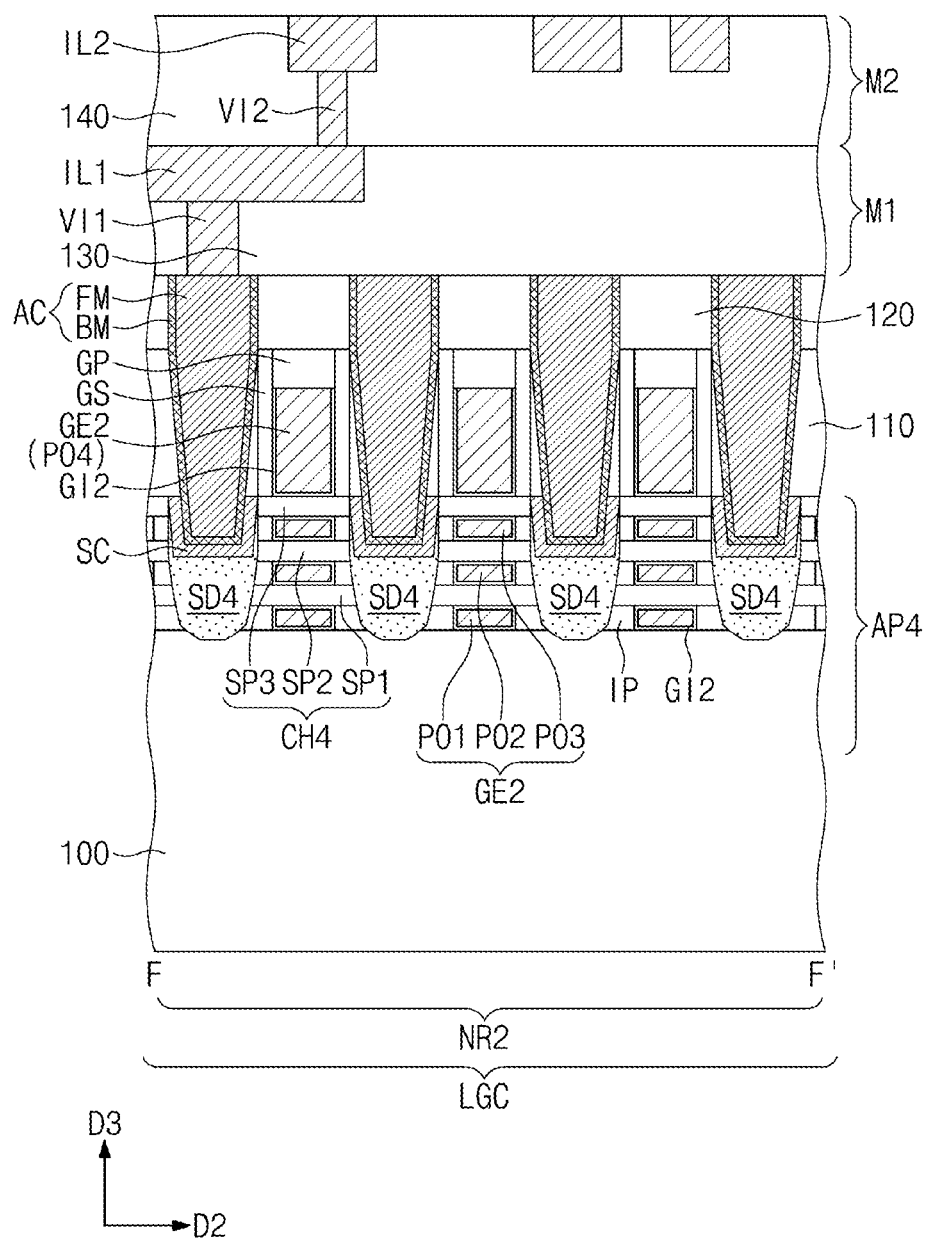
Figure 2G:
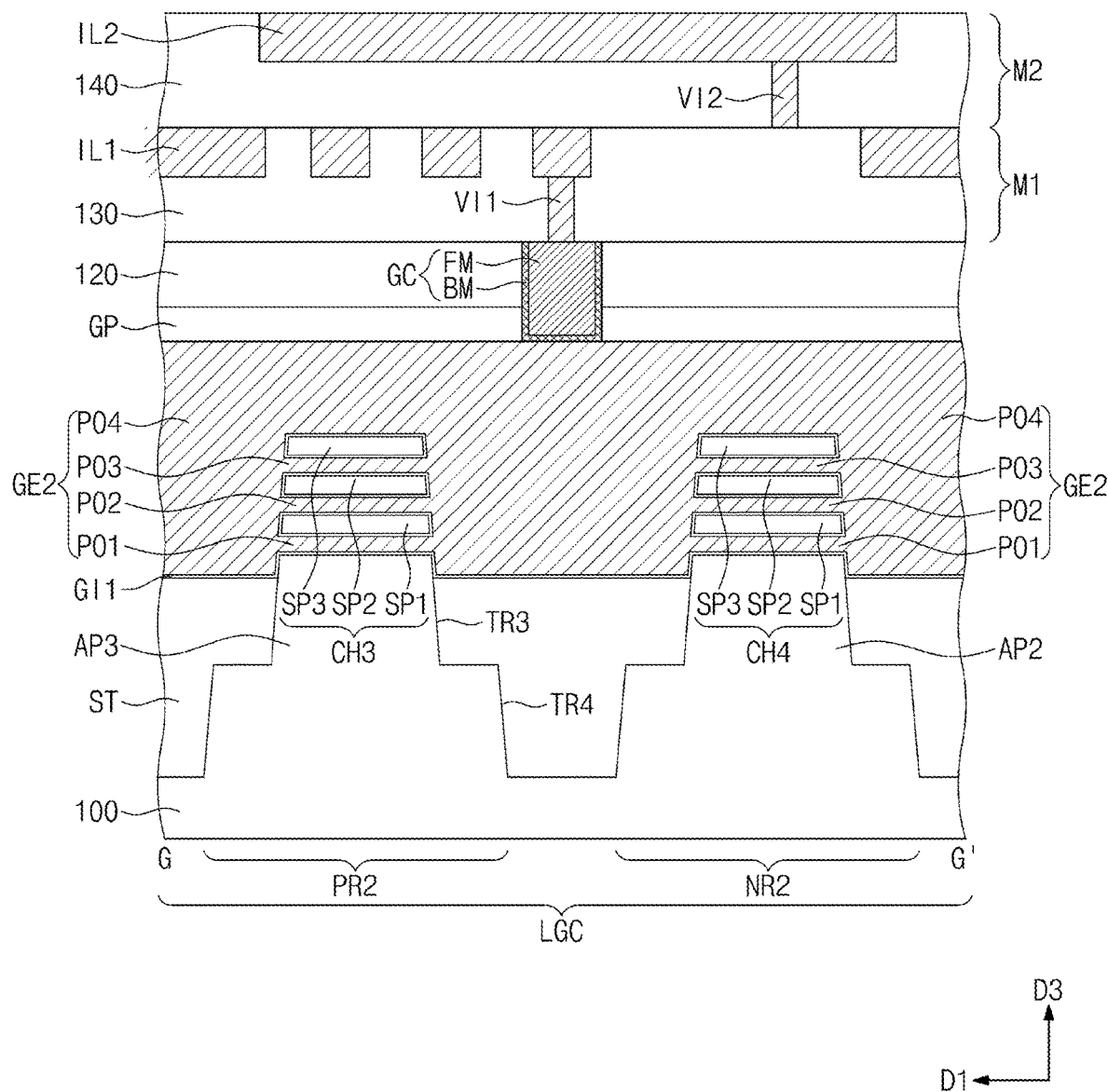
Figure 2H:
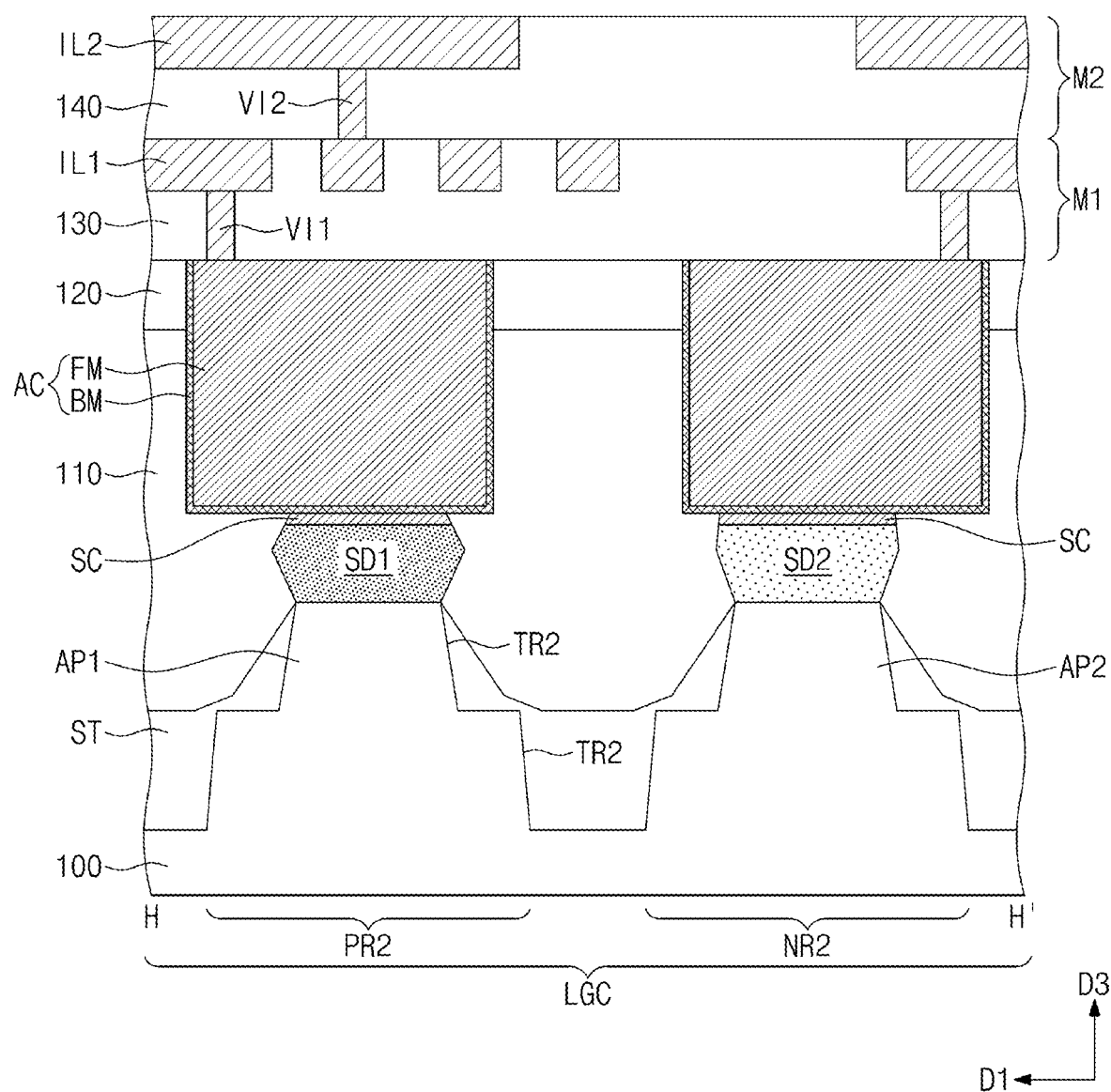
Figure 3:
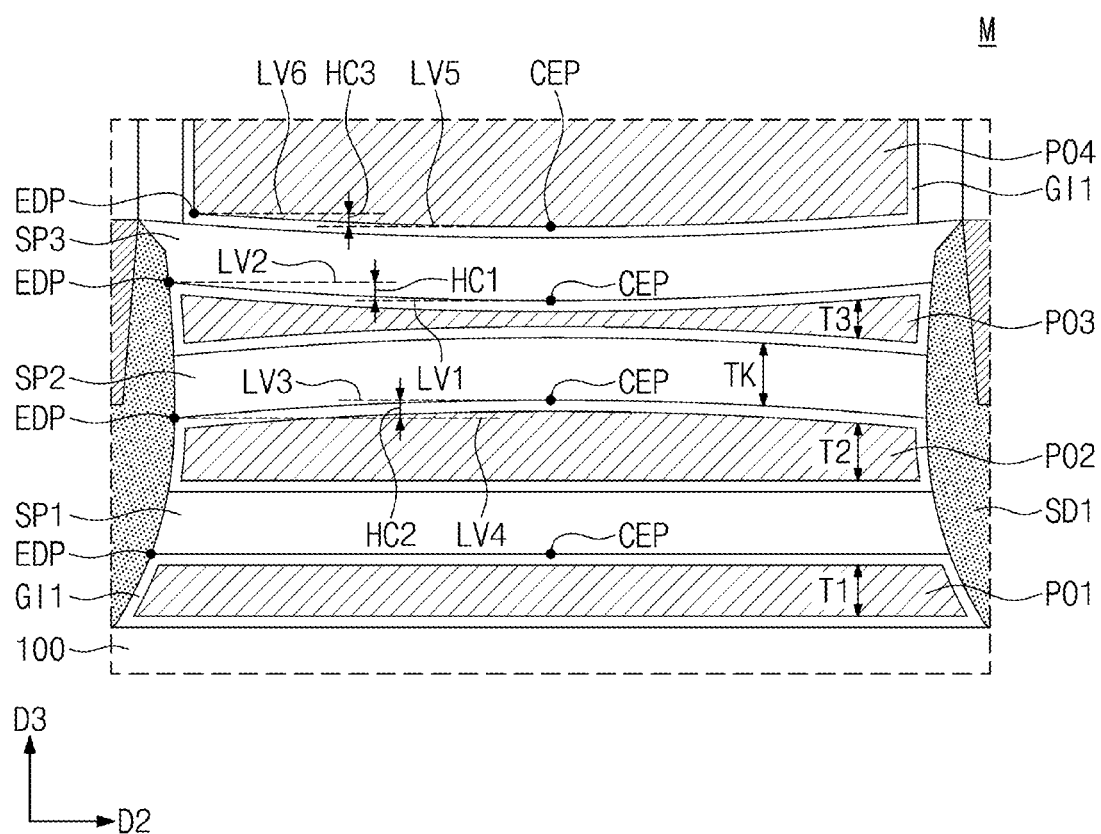
FIG. 3 illustrates an enlarged cross-sectional view of section M of FIG. 2A.

Referring to FIGS. 2A, 2C, and 3, at least one of the first, second, and third semiconductor patterns SP1, SP2, and SP3 may be bent (e.g., curved). In an implementation, at least two selected of the first, second, and third semiconductor patterns SP1, SP2, and SP3 may be bent. The at least one or two semiconductor patterns may be bent in the third direction D3 (e.g., in a vertical direction away from a bottom surface of the substrate 100) or in a direction opposite to the third direction D3 (e.g., in a vertical direction approaching the bottom surface of the substrate 100). In an implementation, the at least one or two semiconductor patterns may be curved such that a concave opening therein is open toward the substrate 100 in the third direction D3. In an implementation, the at least one or two semiconductor patterns may be curved such that a concave opening therein is open away from the substrate 100 in the third direction D3.

In an implementation, the third semiconductor pattern SP3 may be bent in a direction opposite to the third direction D3 (e.g., away from the substrate 100). In an implementation, the third semiconductor pattern SP3 may be bent toward the second semiconductor pattern SP2. In an implementation, the third semiconductor pattern SP3 may have one or both of a curved bottom surface and a curved top surface.

A first height difference HC1 may indicate the degree of bending of the third semiconductor pattern SP3. The first height difference HC1 may be a difference in height (in the third direction D3) between a center point CEP and an edge point EDP at the bottom (or top) surface of the third semiconductor pattern SP3. The edge point EDP at the bottom surface of the third semiconductor pattern SP3 may be in contact with the first source/drain pattern SD1. The edge point EDP at the bottom surface of the third semiconductor pattern SP3 may be in contact with a corner of the first gate dielectric layer GI1.

In an implementation, the center point CEP at the bottom surface of the third semiconductor pattern SP3 may be at a first level LV1, and the edge point EDP at the bottom surface of the third semiconductor pattern SP3 may be at a second level LV2. The first height difference HC1 may be a difference or distance between the first level LV1 and the second level LV2, or LV1-LV2. The second level LV2 may be higher than the first level LV1, and the first height difference HC1 may have a negative value.

The second semiconductor pattern SP2 may be bent in the third direction D3. The second semiconductor pattern SP2 may be bent toward the third semiconductor pattern SP3. The second semiconductor pattern SP2 may have one or both of a curved bottom surface and a curved top surface.

A second height difference HC2 may indicate the degree of bending of the second semiconductor pattern SP2. The second height difference HC2 may be a difference in height (in the third direction D3) between a center point CEP and an edge point EDP at the bottom (or top) surface of the second semiconductor pattern SP2. In an implementation, the center point CEP at the bottom surface of the second semiconductor pattern SP2 may be at a third level LV3, and the edge point EDP at the bottom surface of the second semiconductor pattern SP2 may be at a fourth level LV4. The second height difference HC2 may be a difference or distance between the third level LV3 and the fourth level LV4, or LV3-LV4. In an implementation, the third level LV3 may be higher than the fourth level LV4, and the second height difference HC2 may have a positive value. In an implementation, the second and third semiconductor patterns SP2 and SP3 may be bent toward each other or away from each other. In an implementation, the first height difference HC1 may have a negative value and the second height difference HC2 may have a positive value, e.g., the third semiconductor pattern SP3 may be curved away from the second semiconductor pattern SP2 and vice versa, as illustrated in FIG. 3.

In an implementation, the first semiconductor pattern SP1 may not be bent or curved, and may instead be flat. In an implementation, the first semiconductor pattern SP1 may have one or both of a flat bottom surface and a flat top surface. The degree of bending of the first semiconductor pattern SP1 may be zero or almost zero. There may be no difference in height between the center point CEP and the edge point EDP at the bottom (or top) surface of the first semiconductor pattern SP1.

In an implementation, the degree of bending of the semiconductor pattern SP1, SP2, or SP3 may be defined to refer to a difference in height between the center point CEP and the edge point EDP of the semiconductor pattern SP1, SP2, or SP3. When the degree of bending (or the height difference) of the semiconductor pattern SP1, SP2, or SP3 has a positive value, it may be determined that the semiconductor pattern SP1, SP2, or SP3 is bent in the third direction D3. When the degree of bending (or the height difference) of the semiconductor pattern SP1, SP2, or SP3 has a negative value, it may be determined that the semiconductor pattern SP1, SP2, or SP3 is bent in a direction opposite to the third direction D3.

When a ratio of the bending degree to a thickness TK of the semiconductor pattern SP1, SP2, or SP3 is in a range of about 0.1 to about 2, e.g., about 0.3 to about 2, it may be defined that the semiconductor pattern SP1, SP2, or SP3 is bent. When the ratio of the bending degree to the thickness TK of the semiconductor pattern SP1, SP2, or SP3 is in a range of less than about 0.1, it may be defined that the semiconductor pattern SP1, SP2, or SP3 is flat.

The first part P01 of the first gate electrode GE1 may have a thickness T1 (e.g., in the third direction D3) that is not changed, e.g., and is constant from the center point CEP of the first semiconductor pattern SP1 to the edge point EDP thereof. The thickness T1 of the first part P01 may be substantially constant from its center point to its edge point. The second part P02 of the first gate electrode GE1 may have a thickness T2 that decreases from the center point CEP of the second semiconductor pattern SP2 to the edge point EDP. The thickness T2 of the second part P02 may decrease from its center point to its edge point. The third part P03 of the first gate electrode GE1 may have a thickness T3 that increases from the center point CEP of the third semiconductor pattern SP3 to the edge point EDP thereof. The thickness T3 of the third part P03 may increase from its center point to its edge point.

In an implementation, the thickness T1 at the center point of the first part P01 may be greater than the thickness T3 at the center point of the third part P03. The thickness T2 at the center point of the second part P02 may be greater than the thickness T1 at the center point of the first part P01. In an implementation, the second part P02 may have a volume or cross sectional area greater than that of either other of the first and third parts P01 and P03.

The fourth part P04 of the first gate electrode GE1 may have a curved bottom surface. A third height difference HC3 may indicate the degree of bending or curvature at the bottom surface of the fourth part P04. The third height difference HC3 may be a difference in height between a center point CEP at the bottom surface of the fourth part P04 and an edge point EDP at the bottom surface of the fourth part P04. In an implementation, the center point CEP at the bottom surface of the fourth part P04 may be at a fifth level LV5, and the edge point EDP at the bottom surface of the fourth part P04 may be at a sixth level LV6. The third height difference HC3 may be a difference between the fifth level LV5 and the sixth level LV6, or LV5-LV6. The sixth level LV6 may be higher than the fifth level LV5, and thus the third height difference HC3 may have a negative value. In an implementation, the bottom surface of the fourth part P04 may be bent in a direction opposite to the third direction D3 (e.g., the bottom surface of the fourth part P04 may have a convex shape protruding toward the substrate 100 in the third direction D3).

Figure 4:
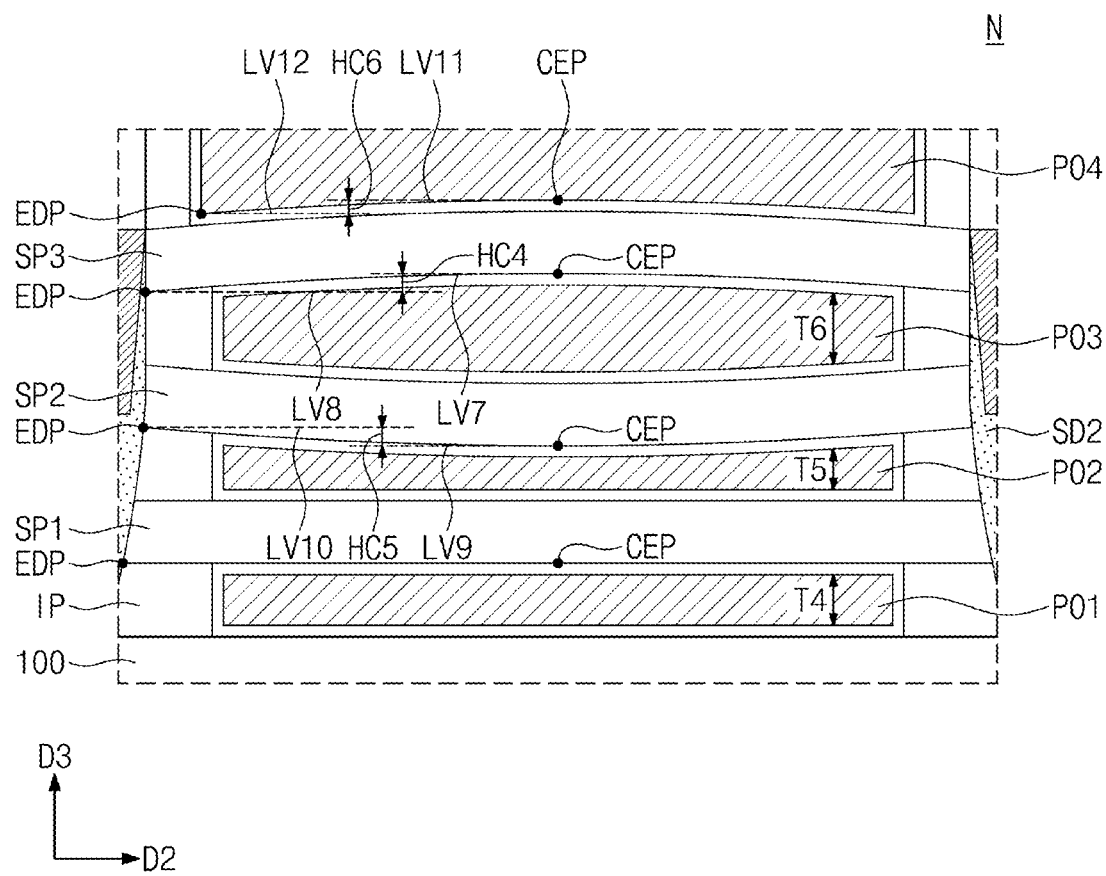
FIG. 4 illustrates an enlarged cross-sectional view of section N of FIG. 2B.
Figure 5:
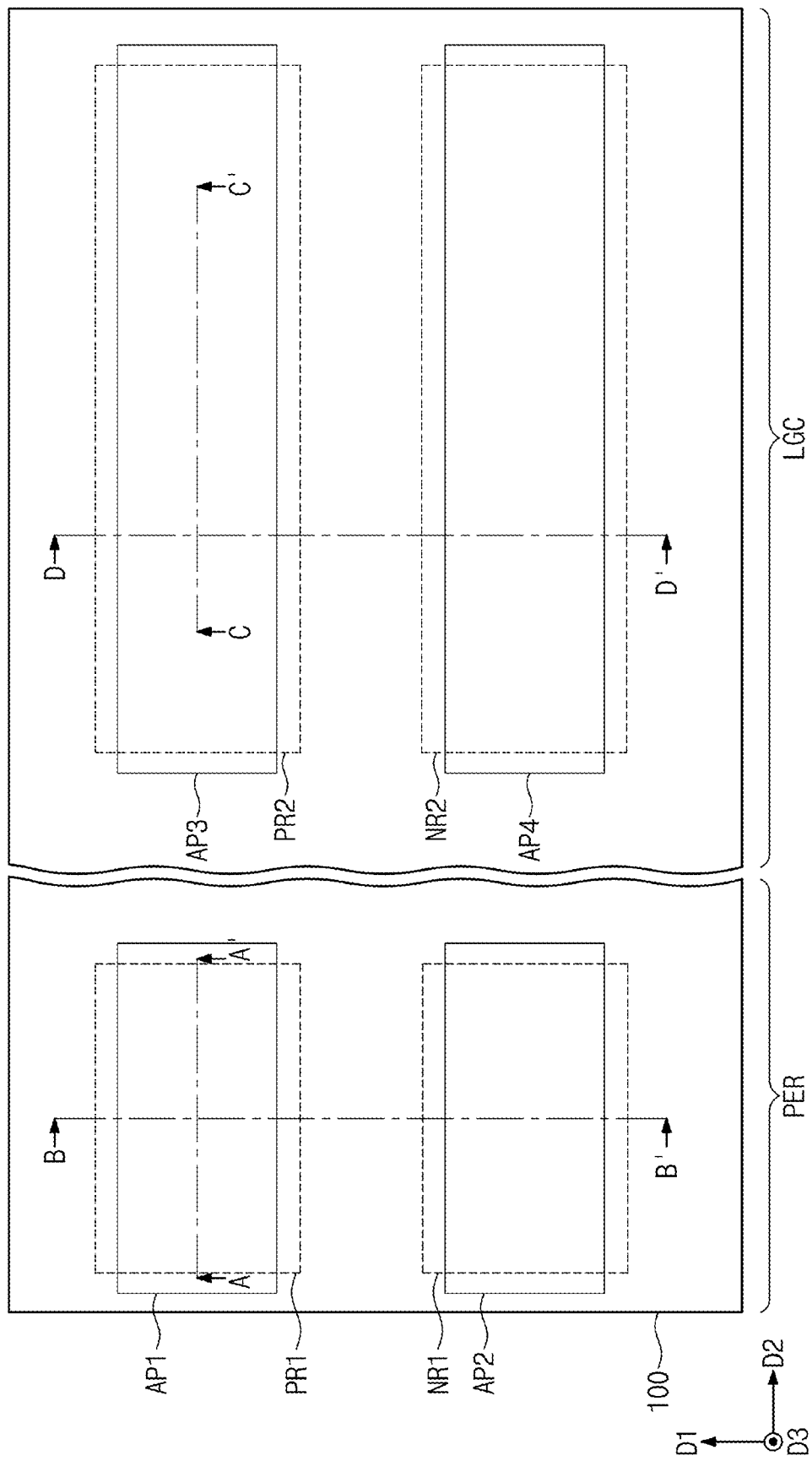
FIGS. 5, 7, 9, 11, and 13 illustrate plan views of stages in a method of fabricating a semiconductor device according to some example embodiments.
Figure 6A:
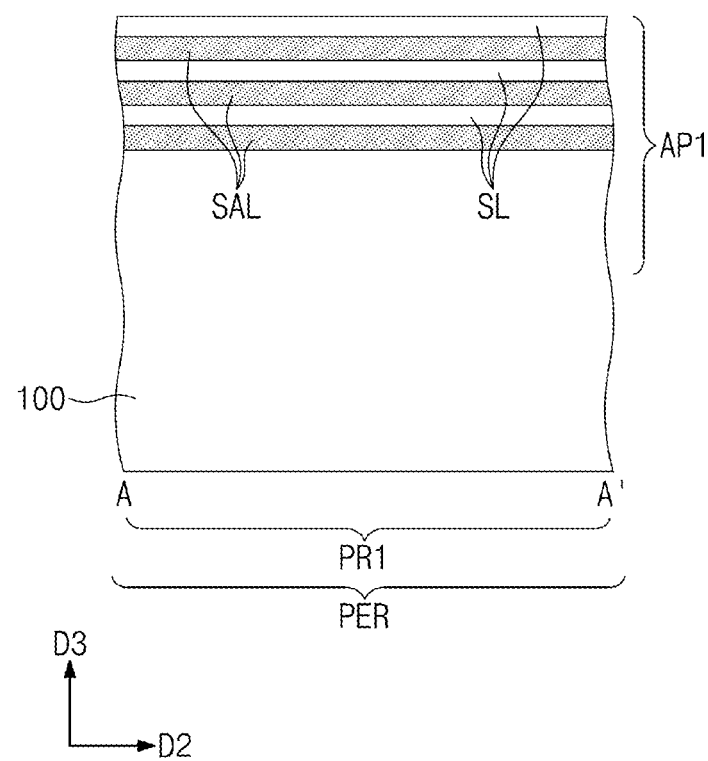
FIGS. 6A, 8A, 10A, 12A, and 14A illustrate cross-sectional views taken along line A-A' of FIGS. 5, 7, 9, 11, and 13, respectively.
Figure 6B:
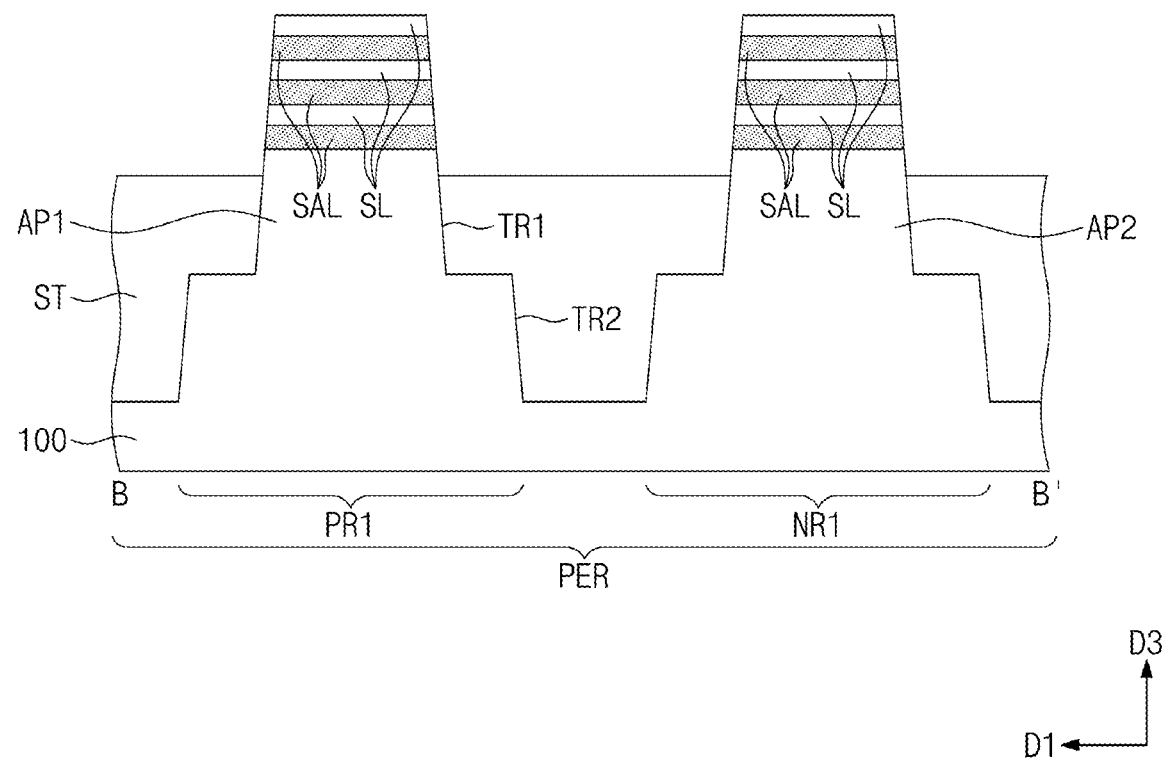
FIGS. 6B, 8B, 10B, 12B, and 14B illustrate cross-sectional views taken along line B-B' of FIGS. 5, 7, 9, 11, and 13, respectively.
Figure 6C:
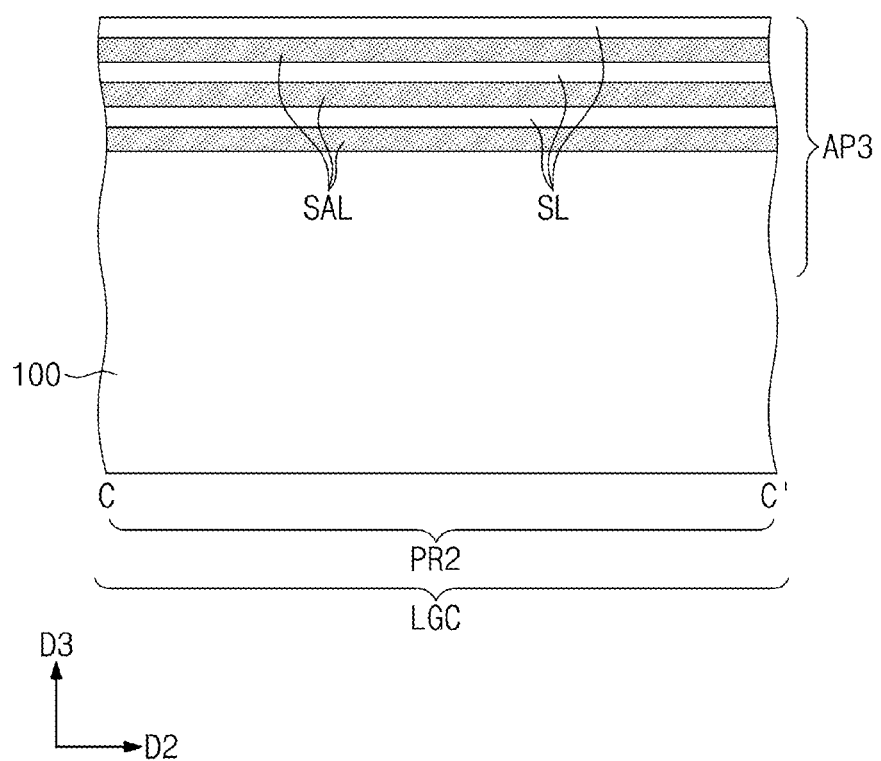
FIGS. 6C, 8C, 10C, 12C, and 14C illustrate cross-sectional views taken along line C-C' of FIGS. 5, 7, 9, 11, and 13, respectively.
Figure 6D:
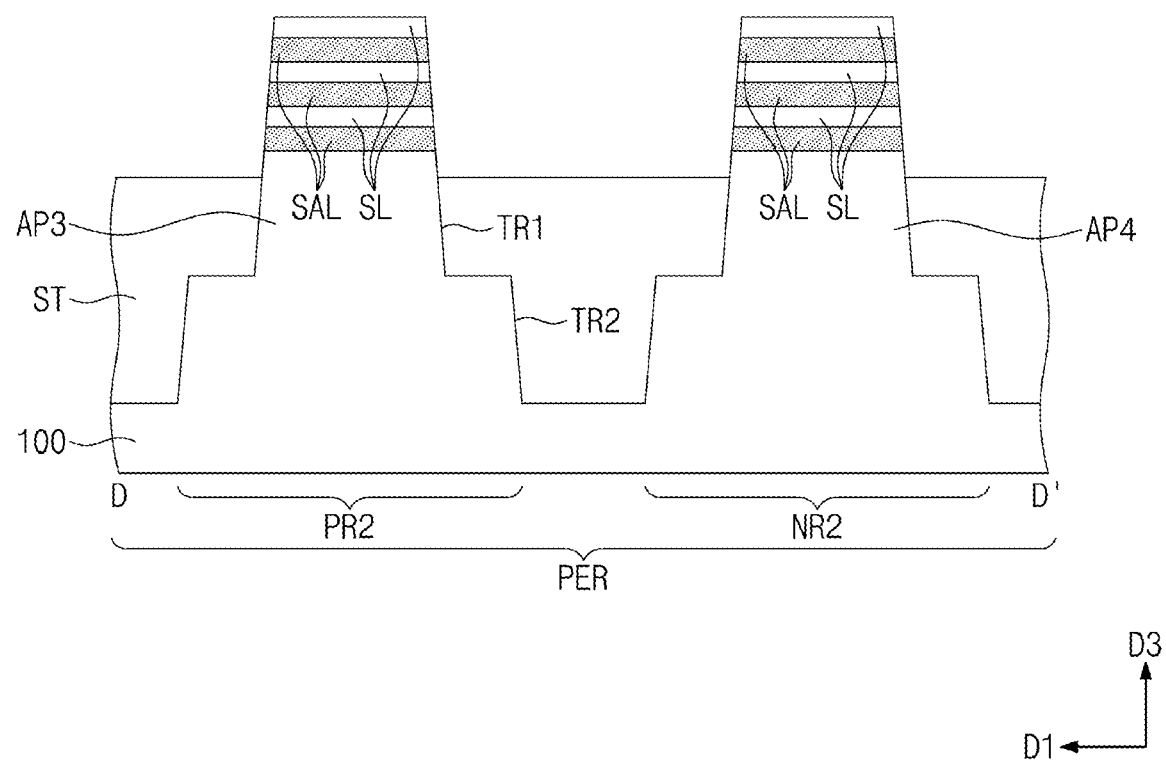
FIGS. 6D, 8D, 10D, 12D, and 14D illustrate cross-sectional views taken along line D-D' of FIGS. 5, 7, 9, 11, and 13, respectively.
Figure 7:
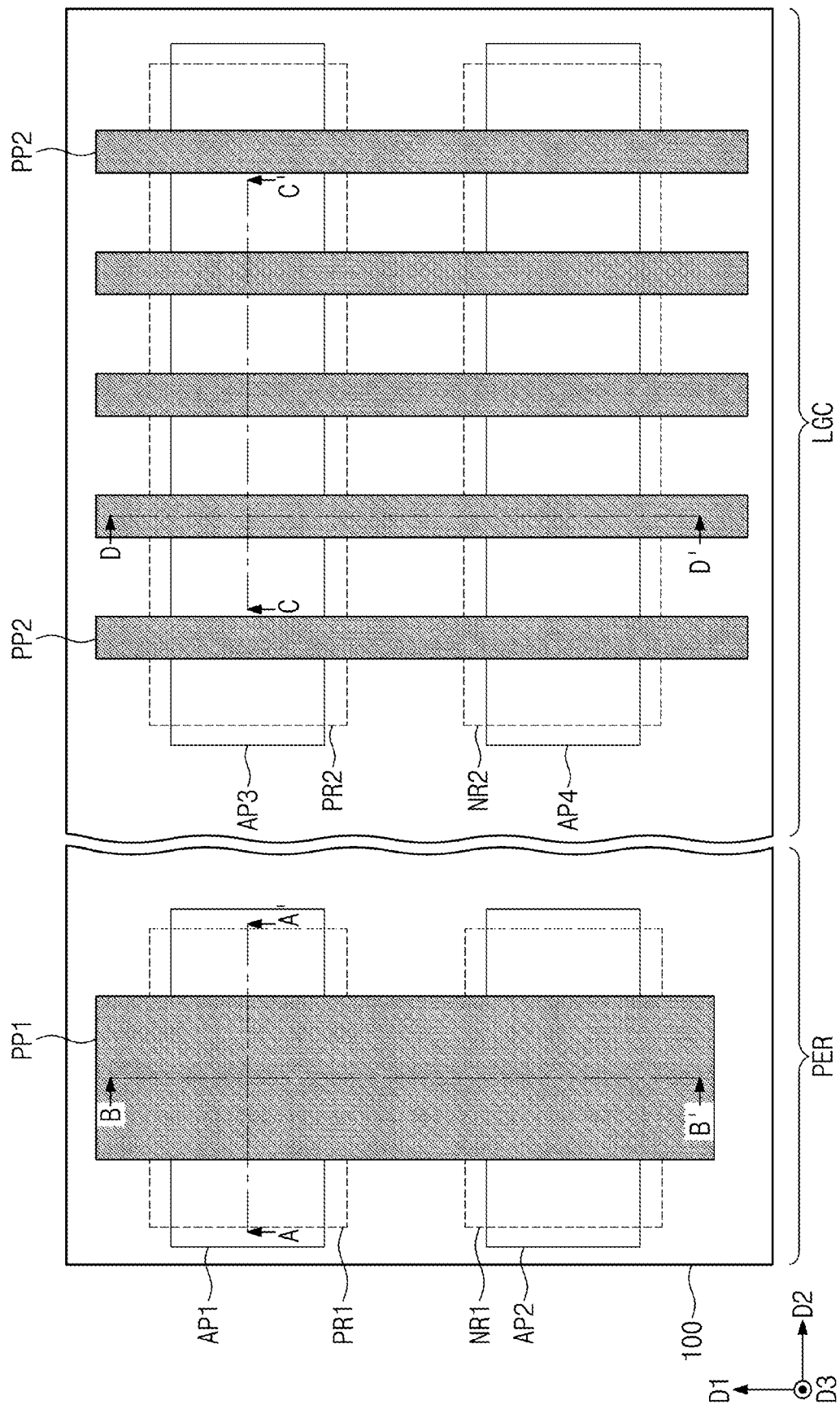
Figure 8A:
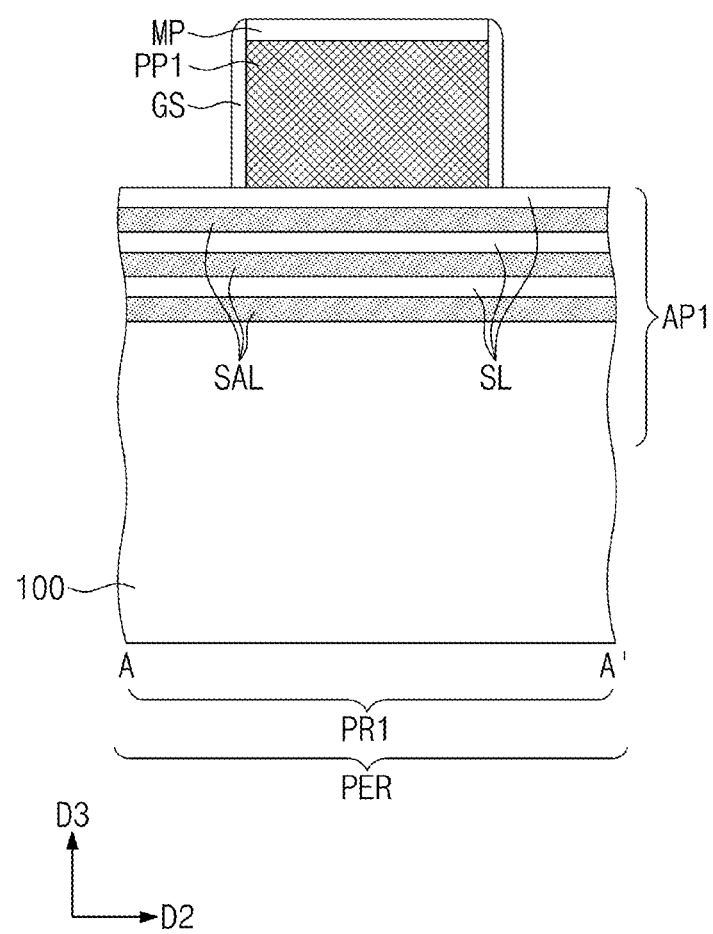
Figure 8B:
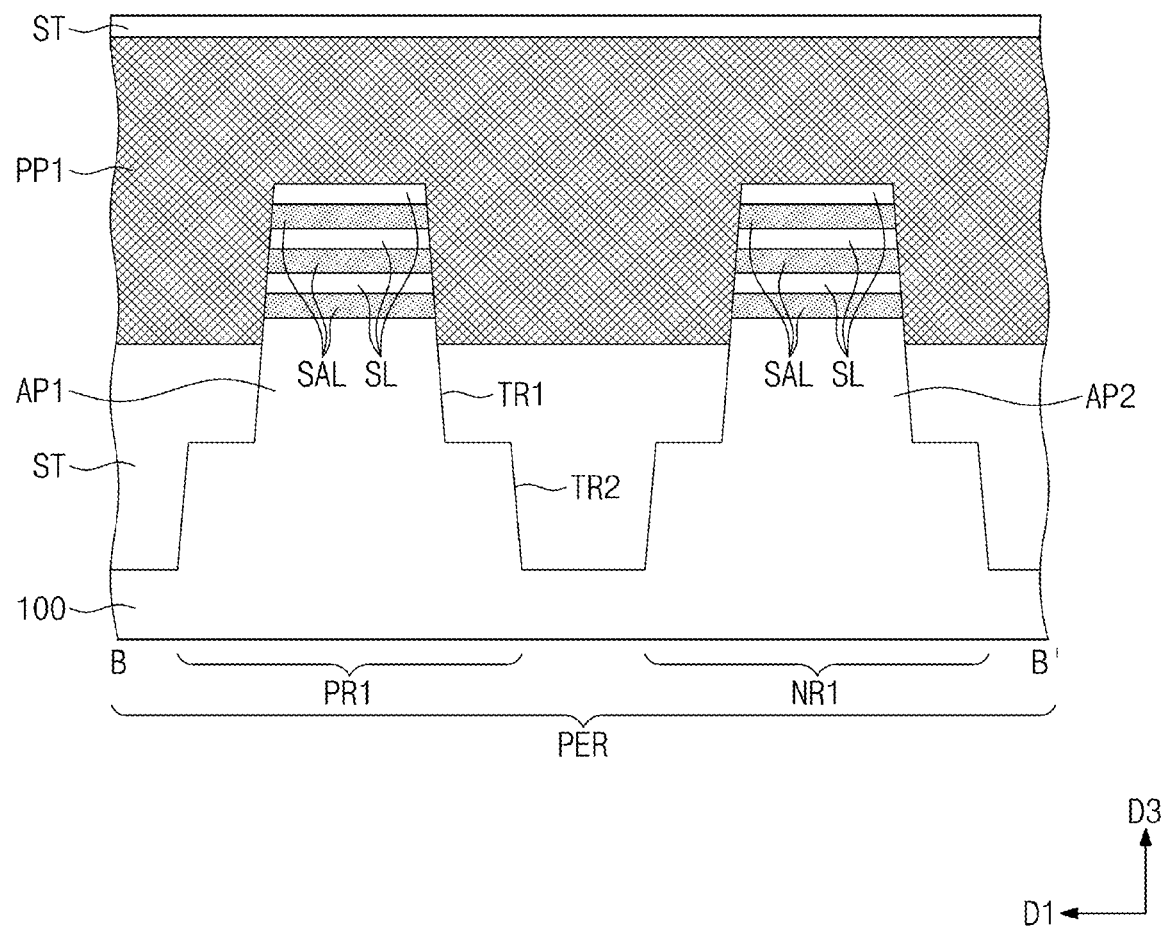
Figure 8C:
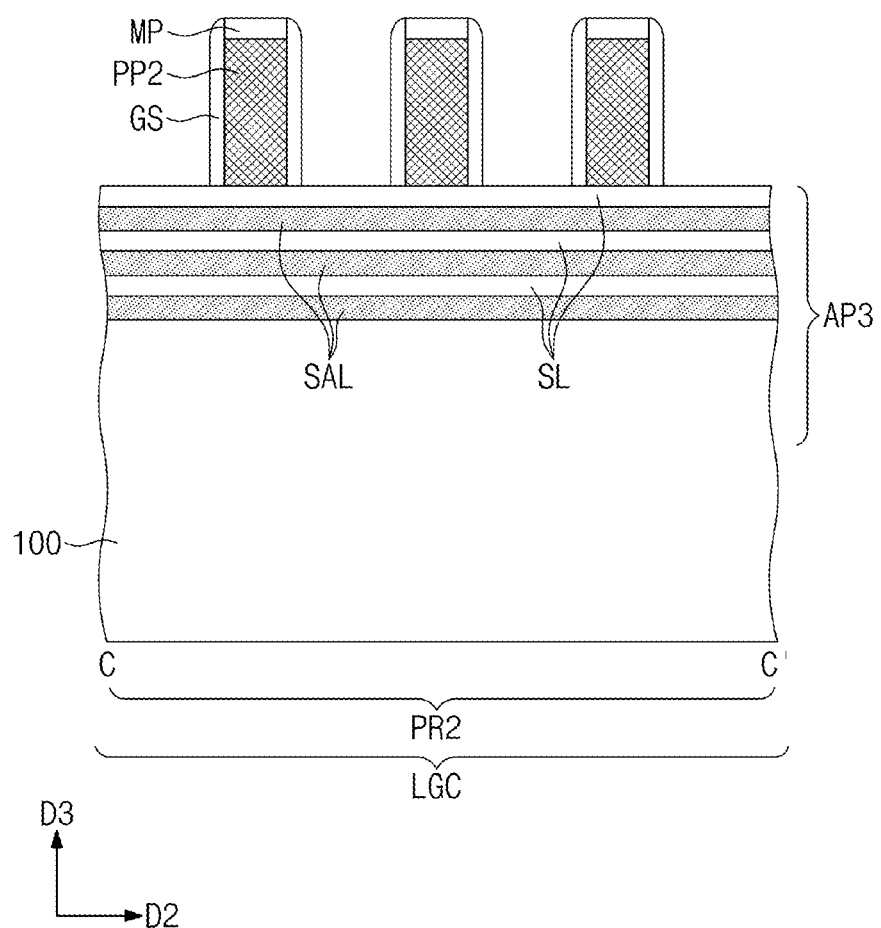
Figure 8D:
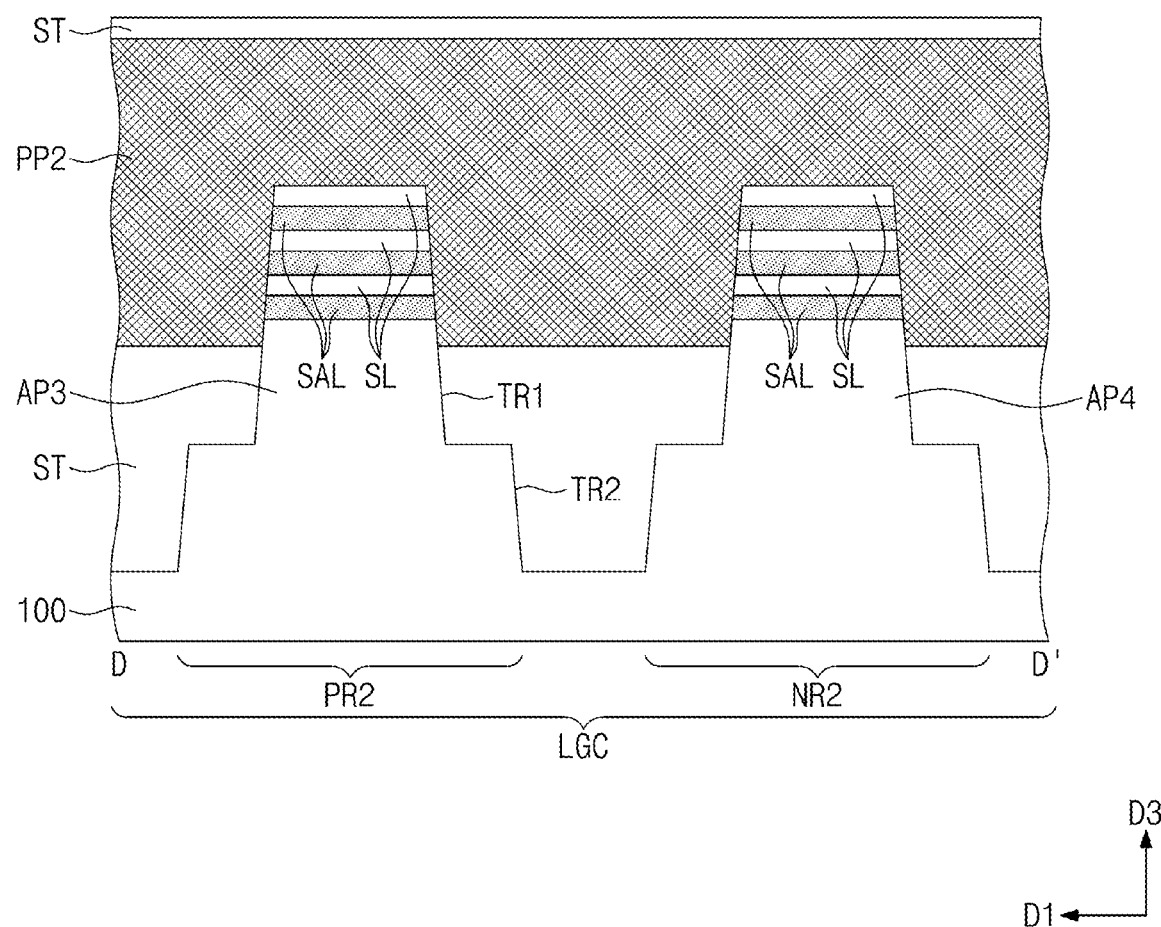
Figure 9:
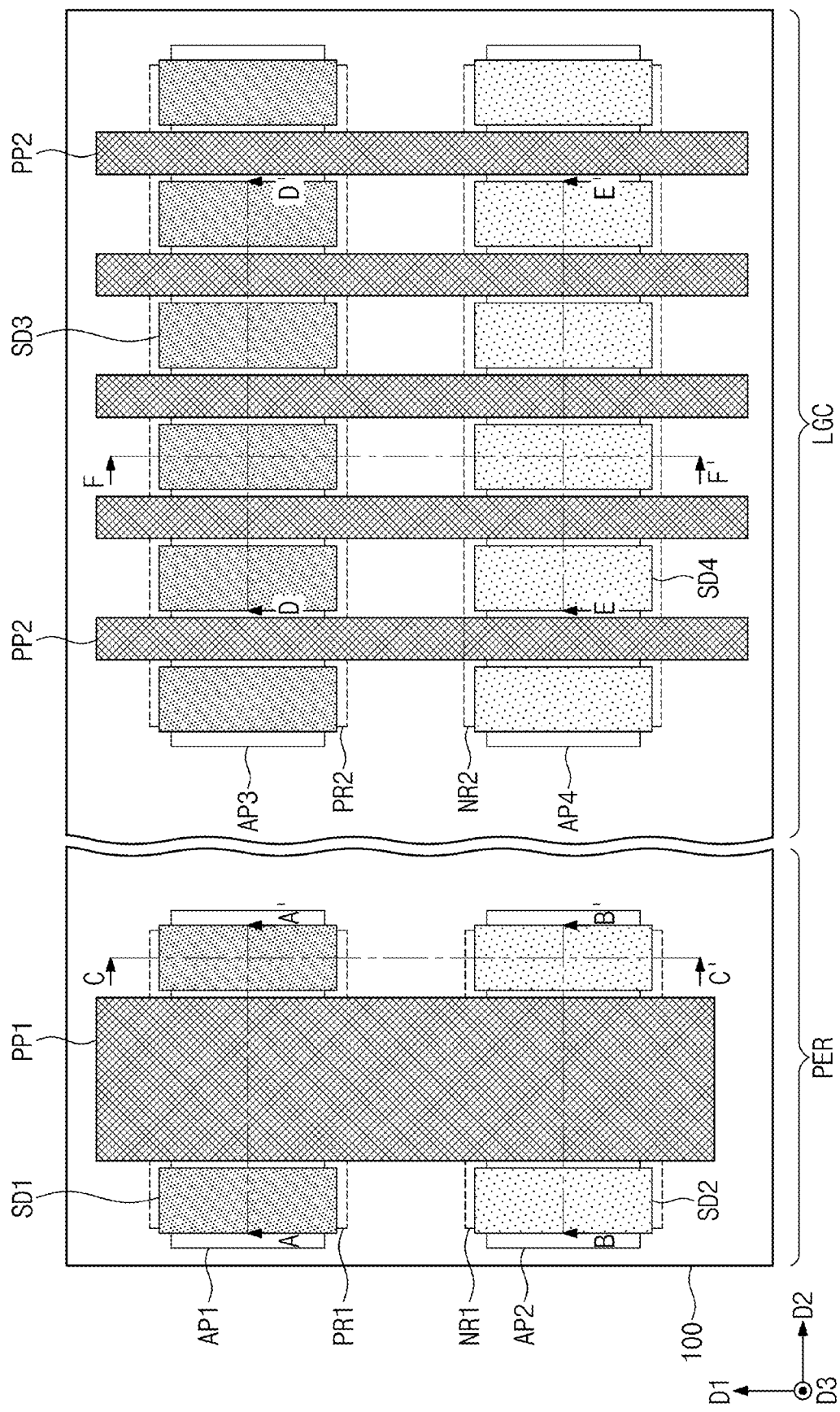

The following will further discuss in detail the first, second, and third semiconductor patterns SP1, SP2, and SP3 of the second channel pattern CH2 on the peripheral region PER mentioned above. FIG. 4 illustrates an enlarged cross-sectional view of section N of FIG. 2B.

Referring to FIGS. 2A, 2C, and 4, at least one of the first, second, and third semiconductor patterns SP1, SP2, and SP3 may be bent or curved. In an implementation, at least two of the first, second, and third semiconductor patterns SP1, SP2, and SP3 may be bent. The at least one or two semiconductor patterns may be bent in the third direction D3 or in a direction opposite to the third direction D3.

In an implementation, the third semiconductor pattern SP3 may be bent in the third direction D3. The third semiconductor pattern SP3 may be bent in a direction away from the second semiconductor pattern SP2 (e.g., may have a convex surface protruding away from the second semiconductor pattern SP2 in the third direction D3). The third semiconductor pattern SP3 may have one or both of a curved bottom surface and a curved top surface.

A fourth height difference HC4 may indicate the degree of bending of the third semiconductor pattern SP3. The center point CEP at the bottom surface of the third semiconductor pattern SP3 may be at a seventh level LV7, and the edge point EDP at the bottom surface of the third semiconductor pattern SP3 may be at an eighth level LV8. The fourth height difference HC4 may be a difference between the seventh level LV7 and the eighth level LV8, or LV7-LV8. The seventh level LV7 may be higher than the eighth level LV8, and the fourth height difference HC4 may have a positive value.

The second semiconductor pattern SP2 may be bent in a direction opposite to the bending direction of the third direction D3. The second semiconductor pattern SP2 may be bent (e.g., to have a convex curved shape protruding) toward the first semiconductor pattern SP1. The second semiconductor pattern SP2 may have one or both of a curved bottom surface and a curved top surface.

A fifth height difference HC5 may indicate the degree of bending of the second semiconductor pattern SP2. The center point CEP at the bottom surface of the second semiconductor pattern SP2 may be at a ninth level LV9, and the edge point EDP at the bottom surface of the second semiconductor pattern SP2 may be at a tenth level LV10. The fifth height difference HC5 may be a difference between the ninth level LV9 and the tenth level LV10, or LV9-LV10. The tenth level LV10 may be higher than the ninth level LV9, and the fifth height difference HC5 may have a negative value.

In an implementation, the second and third semiconductor patterns SP2 and SP3 may be bent away from (e.g., in opposite directions relative to) each other. The first semiconductor pattern SP1 may not be bent, and may be flat.

The first part P01 of the first gate electrode GE1 may have a thickness T4 that is not changed, e.g., that is constant across its length, from the center point CEP of the first semiconductor pattern SP1 to the edge point EDP thereof. The second part P02 of the first gate electrode GE1 may have a thickness T5 that increases from the center point CEP of the second semiconductor pattern SP2 to the edge point EDP thereof. The thickness T5 of the second part P02 may increase from its center point to its edge point. The third part P03 of the first gate electrode GE1 may have a thickness T6 that decreases from the center point CEP of the third semiconductor pattern SP3 to the edge point EDP thereof. The thickness T6 of the third part P03 may decrease from its center point to its edge point.

The thickness T4 at the center point of the first part P01 may be greater than the thickness T5 at the center point of the second part P02. The thickness T6 at the center point of the third part P03 may be greater than the thickness T4 at the center point of the first part P01. In an implementation, the third part P03 may have a volume or cross sectional area greater than that of any other of the first and second parts P01 and P02.

The fourth part P04 of the first gate electrode GE1 may have a curved bottom surface. A sixth height difference HC6 may indicate the degree of bending or curvature at the bottom surface of the fourth part P04. The center point CEP at the bottom surface of the fourth part P04 may be at an eleventh level LV11, and the edge point EDP at the bottom surface of the fourth part P04 may be at a twelfth level LV12. The sixth height difference HC6 may be a difference between the eleventh level LV11 and the twelfth level LV12. The eleventh level LV11 may be higher than the twelfth level LV12, and the sixth height difference HC6 may have a positive value. The bottom surface of the fourth part P04 may be bent in the third direction D3. For example, bottom surface of the fourth part P04 may be convex.

As discussed with reference to FIGS. 3 and 4, an aspect of bending of a semiconductor pattern on the first PMOSFET region PR1 may be different from an aspect of bending of a semiconductor pattern of the first NMOSFET region NR1. A semiconductor pattern of a long-gate transistor in accordance with some example embodiments may be bent in various ways, and the following will describe examples thereof.

In an implementation, each of the first, second, and third semiconductor patterns SP1, SP2, and SP3 that constitute a channel may be adjusted to its direction and degree of bending, and the first, second, and third parts P01, P02, and P03 of the first gate electrode GE1 may be controlled to have different volumes from each other. In an implementation, even when long-gate transistors have the same size, the transistors may be adjusted to have different driving forces.

In an implementation, a long-gate PMOSFET of FIG. 3 may be adjusted such that the second part P02 of the first gate electrode GE1 has a volume greater than that of any other of the first and third parts P01 and P03 of the first gate electrode GE1. A long-gate NMOSFET of FIG. 4 may be adjusted such that the third part P03 of the first gate electrode GE1 has a volume greater than that of any other of the first and second parts P01 and P02 of the first gate electrode GE1. In an implementation, when a difference in driving force is required between PMOSFET and NMOSFET, a variation in physical structure shown in FIG. 3 or 4 may generate the difference in driving force even if the PMOSFET and NMOSFET have the same size.

Figure 10A:
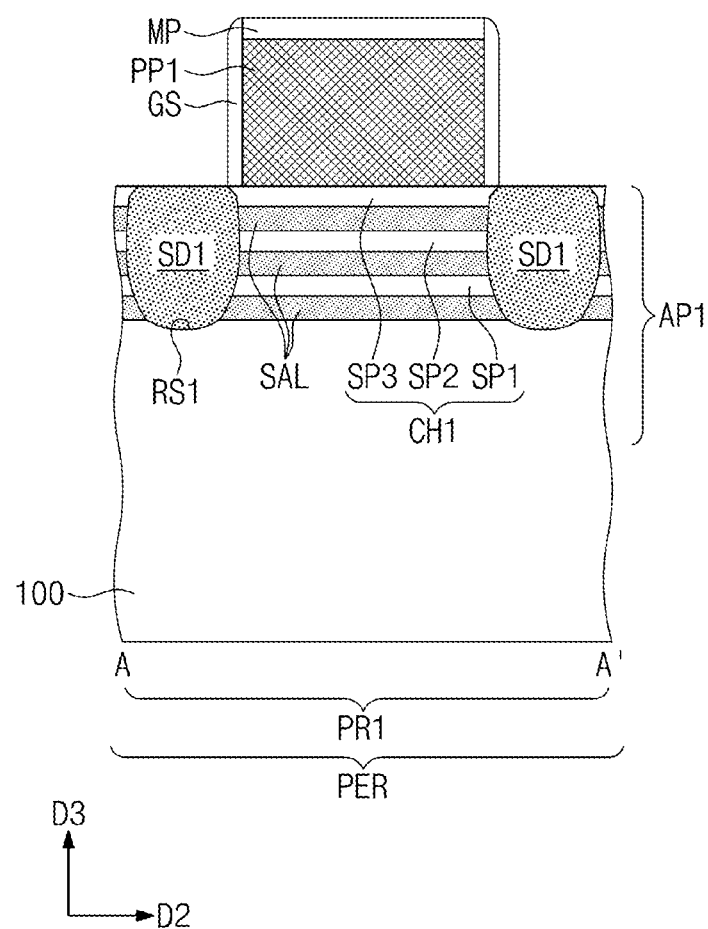
Figure 10B:
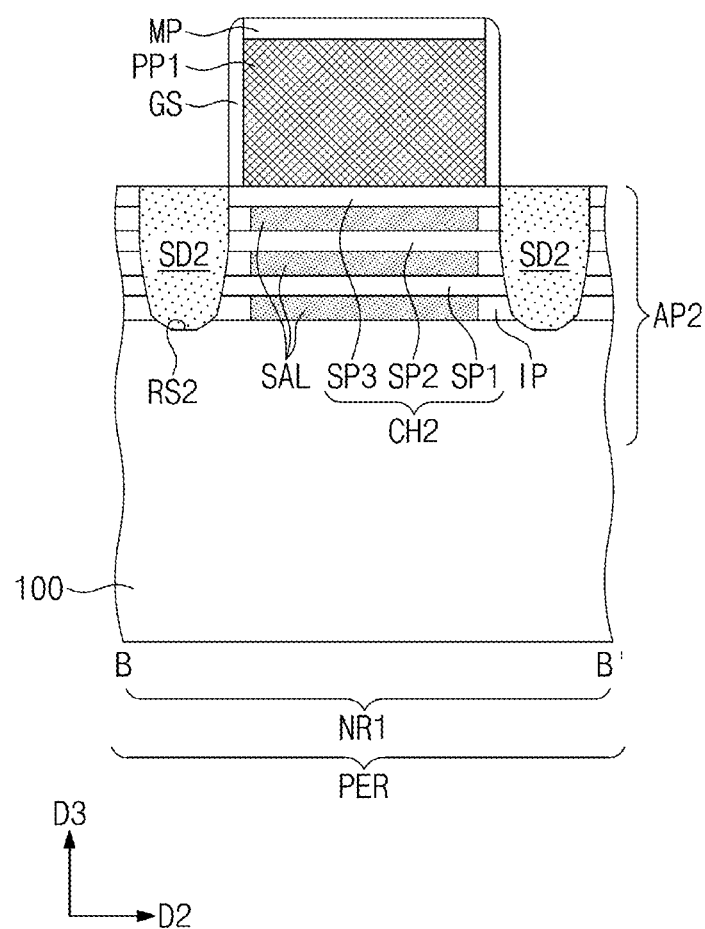
Figure 10C:
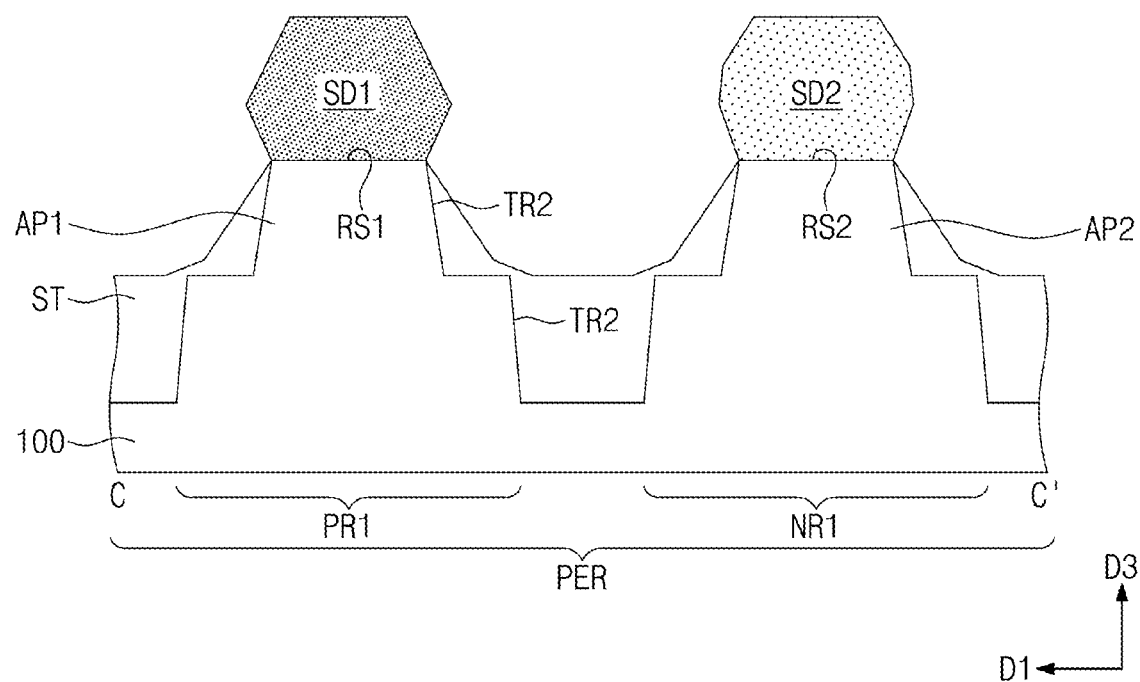
Figure 10D:
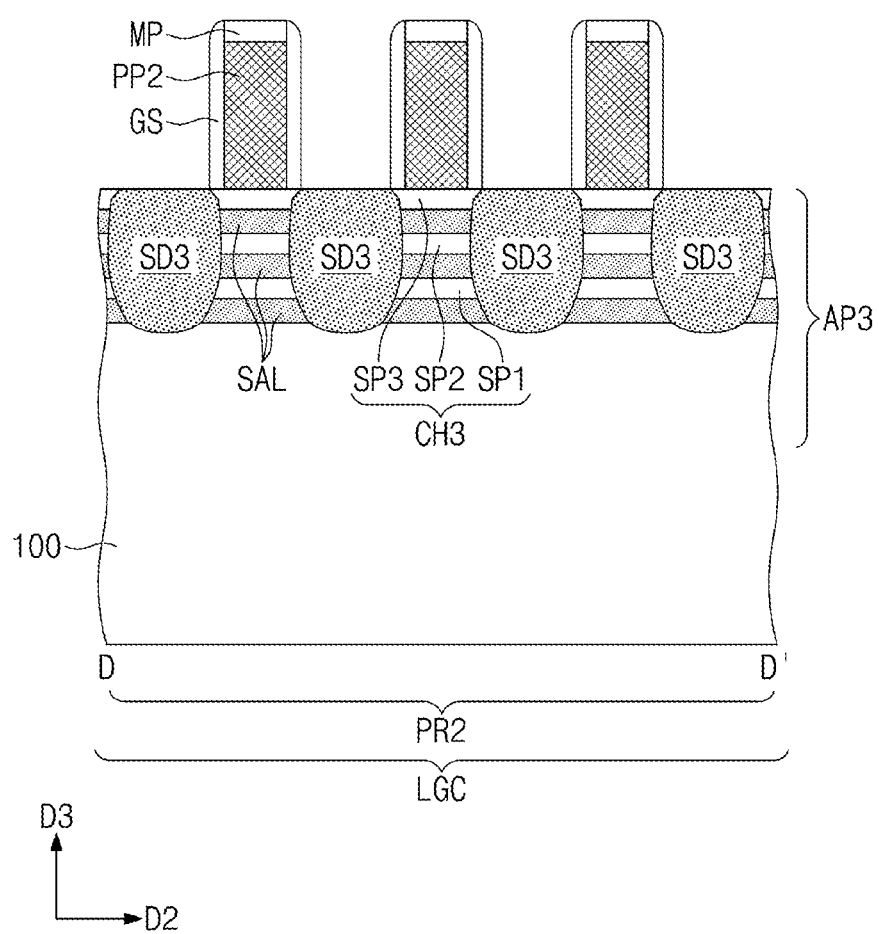
Figure 10E:
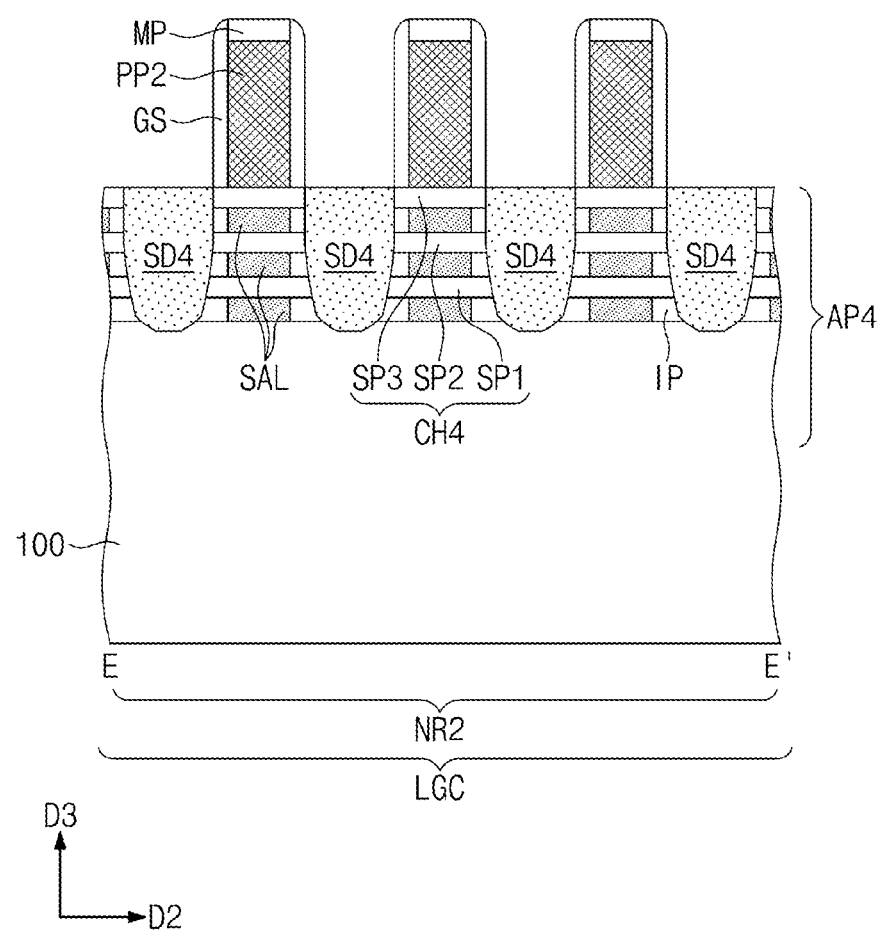
FIGS. 10E, 12E, and 14E illustrate cross-sectional views taken along line E-E' of FIGS. 9, 11, and 13, respectively.
Figure 10F:
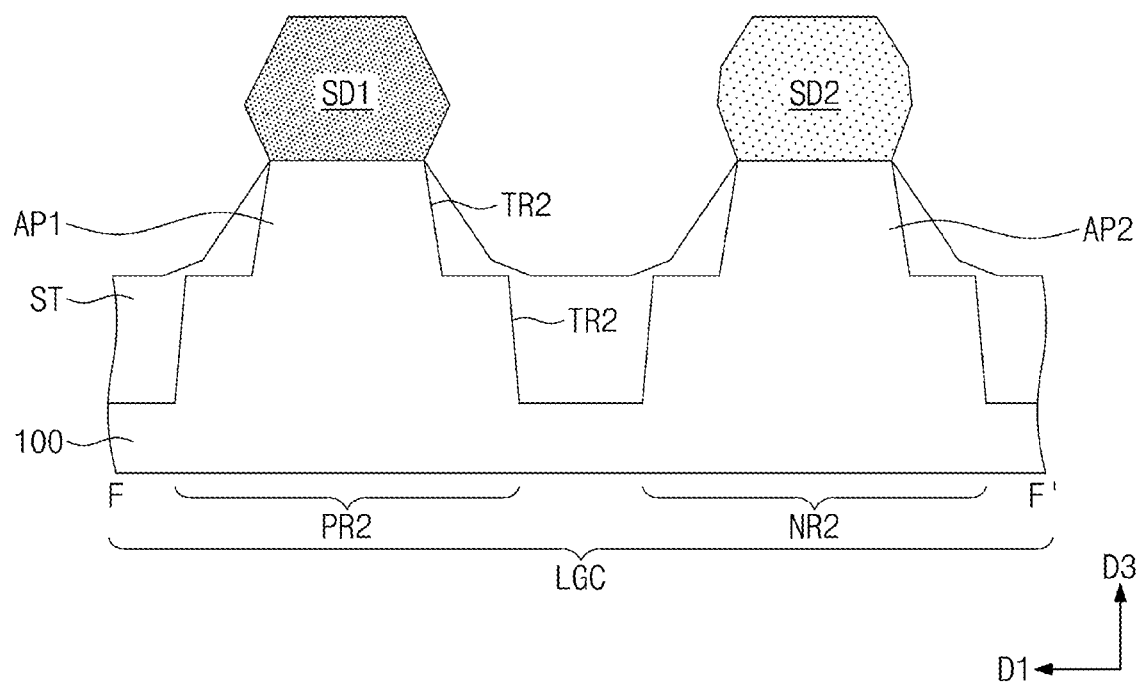
FIGS. 10F, 12F, and 14F illustrate cross-sectional views taken along line F-F' of FIGS. 9, 11, and 13, respectively.
Figure 11:
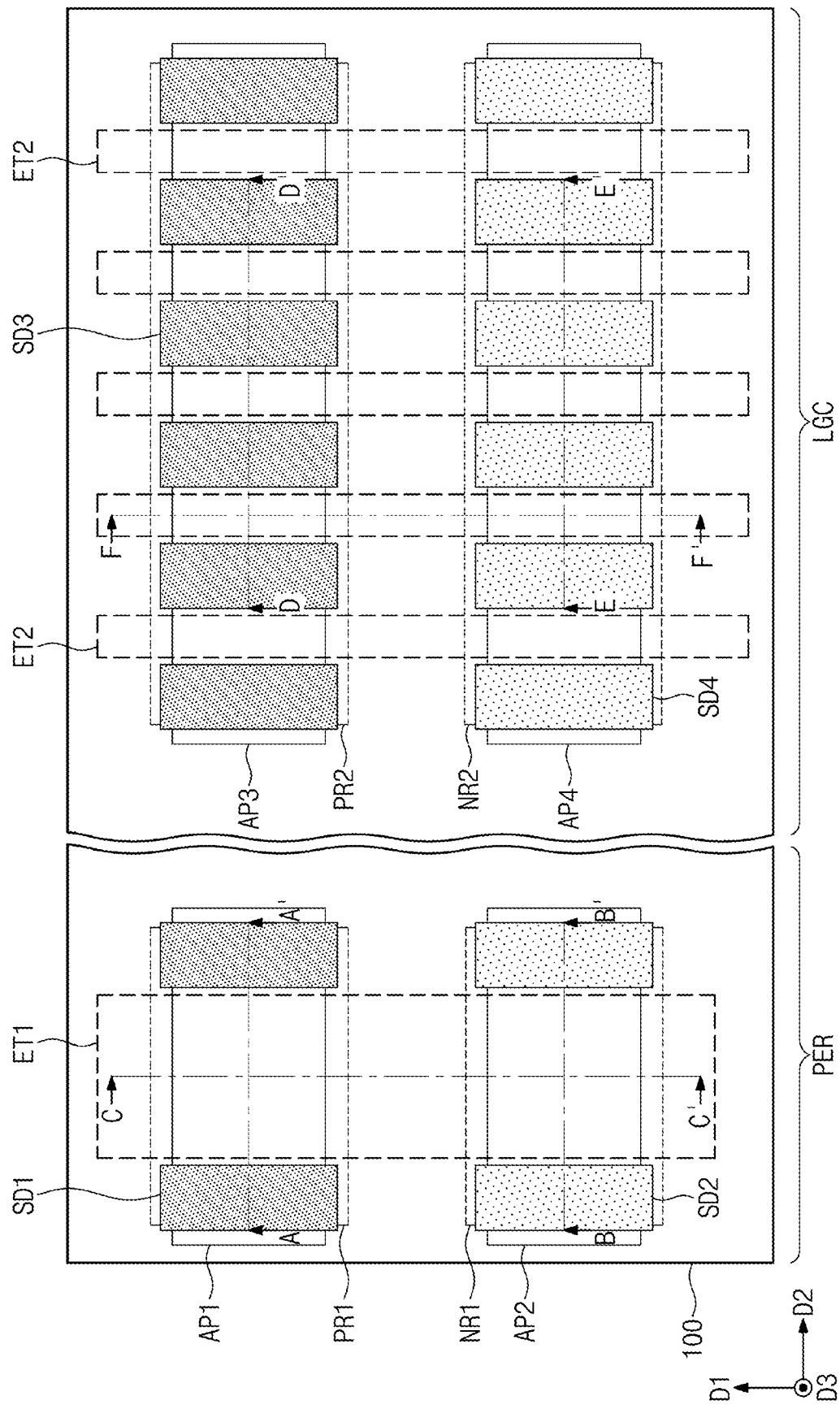
Figure 14A:
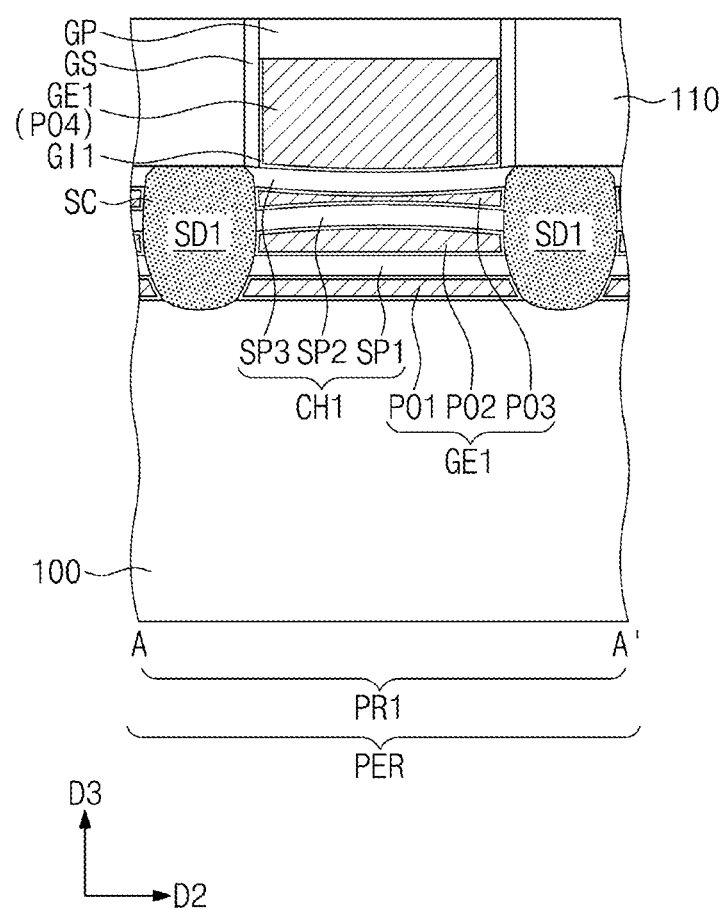
Figure 14B:
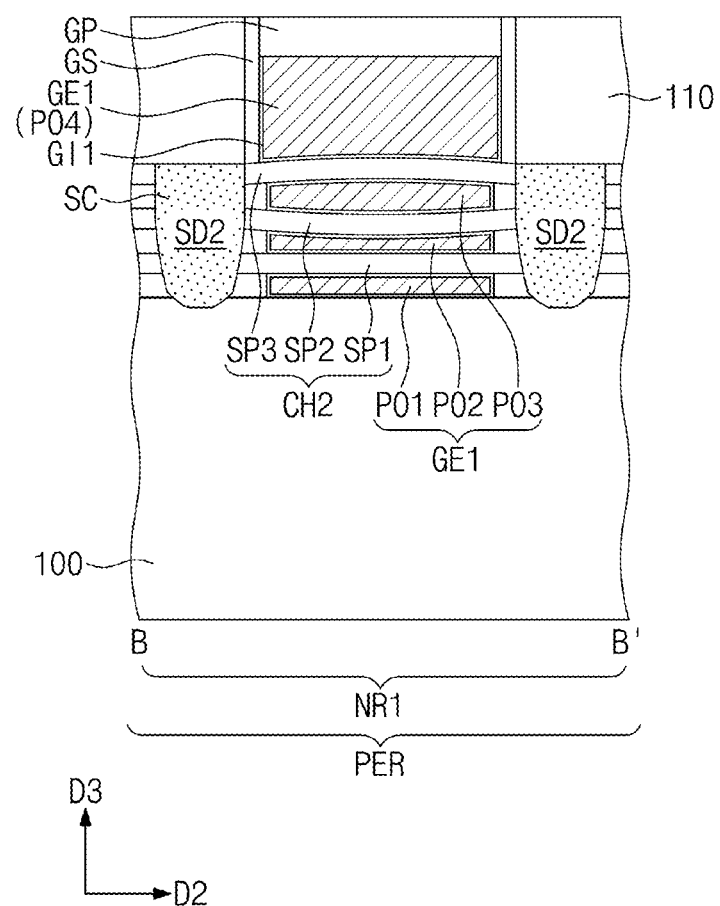
Figure 14C:
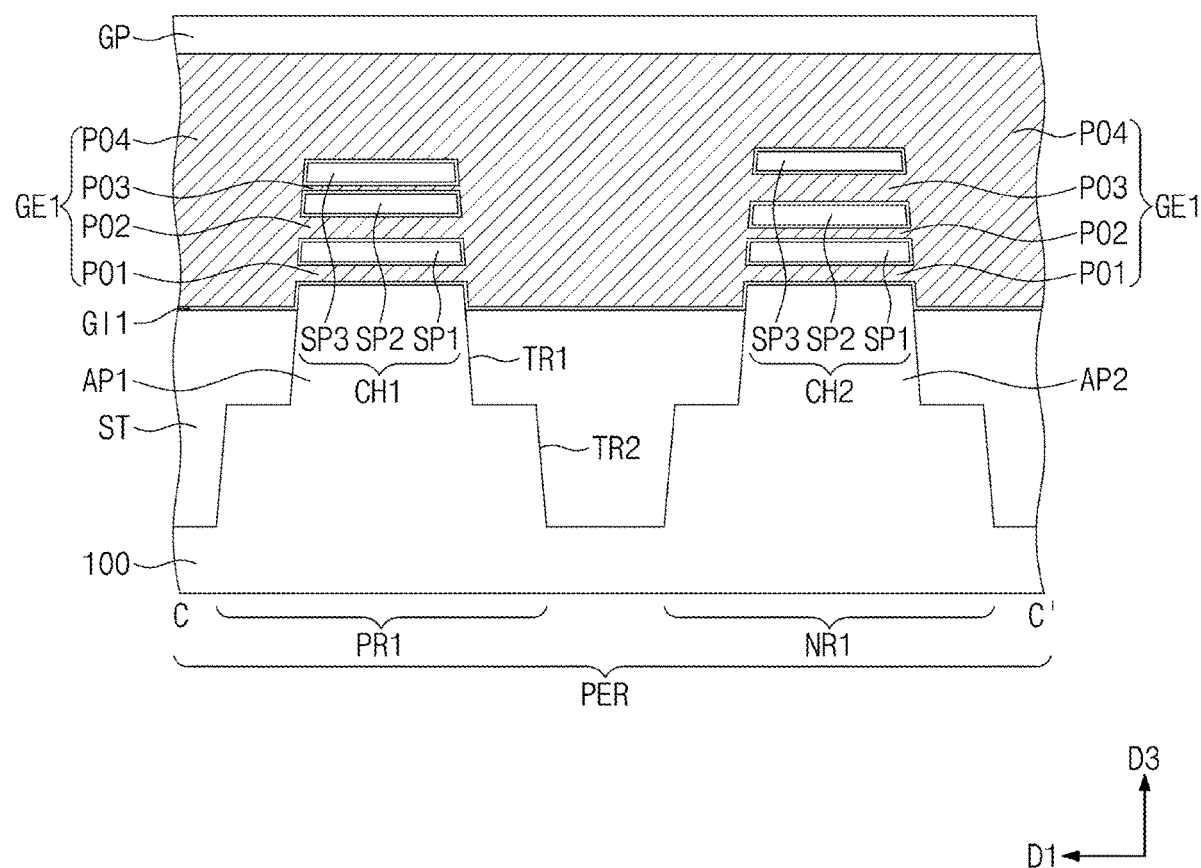
Figure 14D:
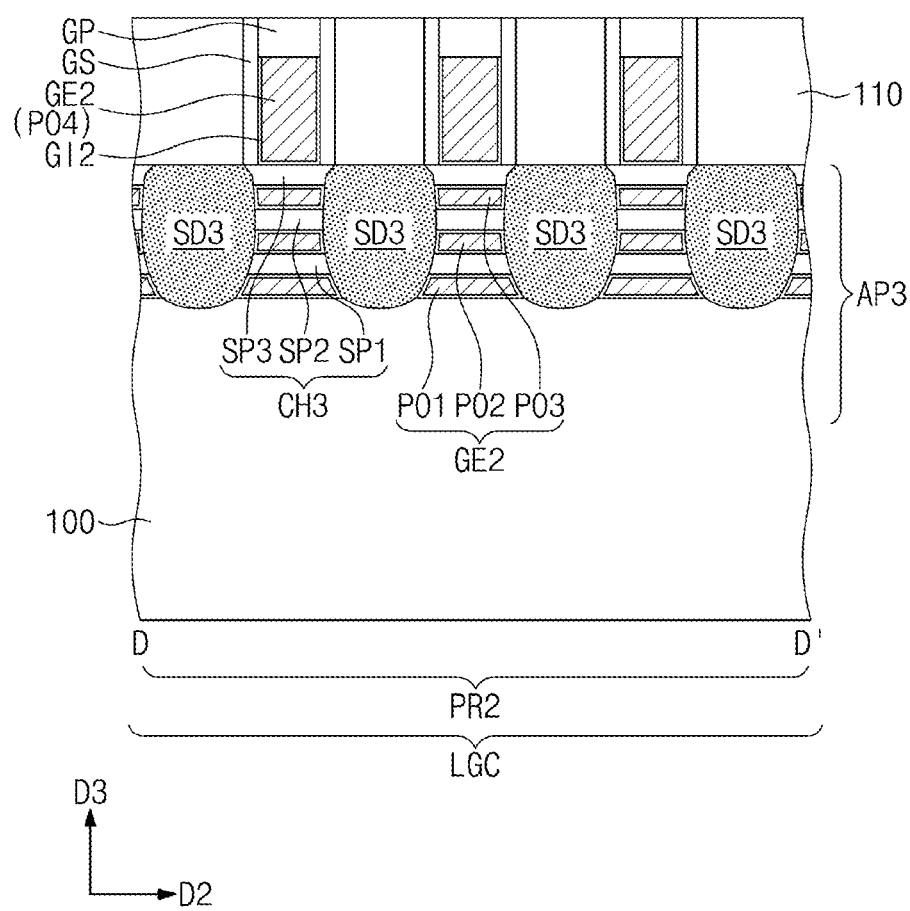
Figure 14E:
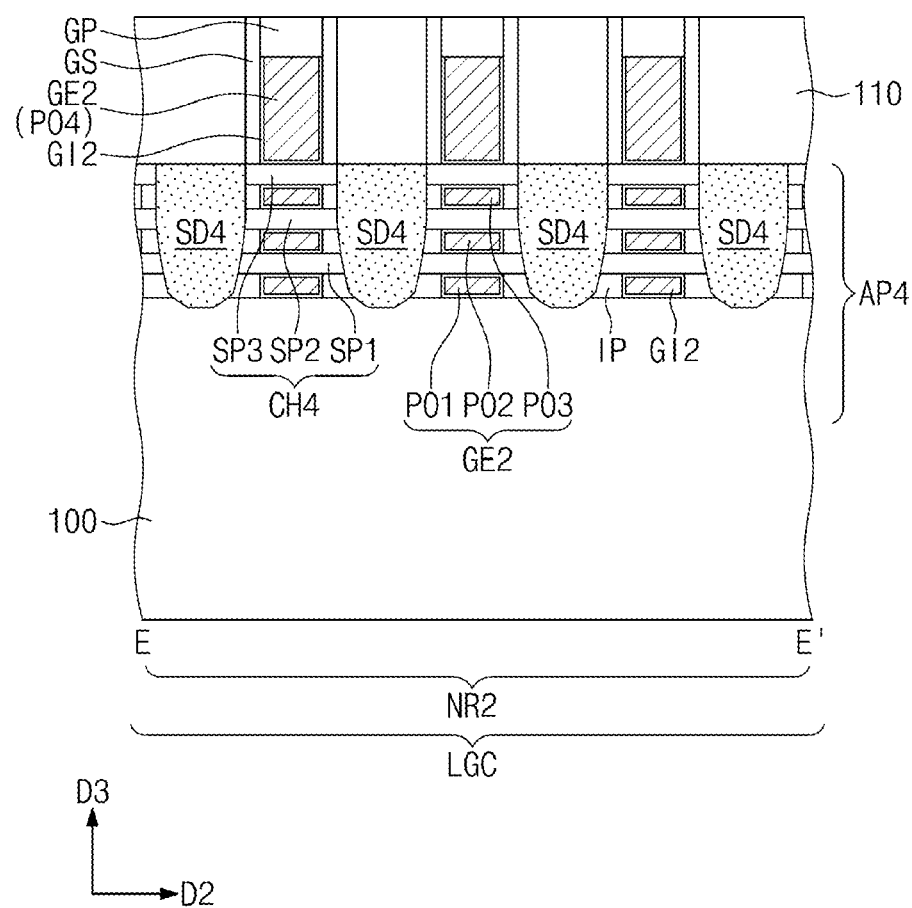
Figure 14F:
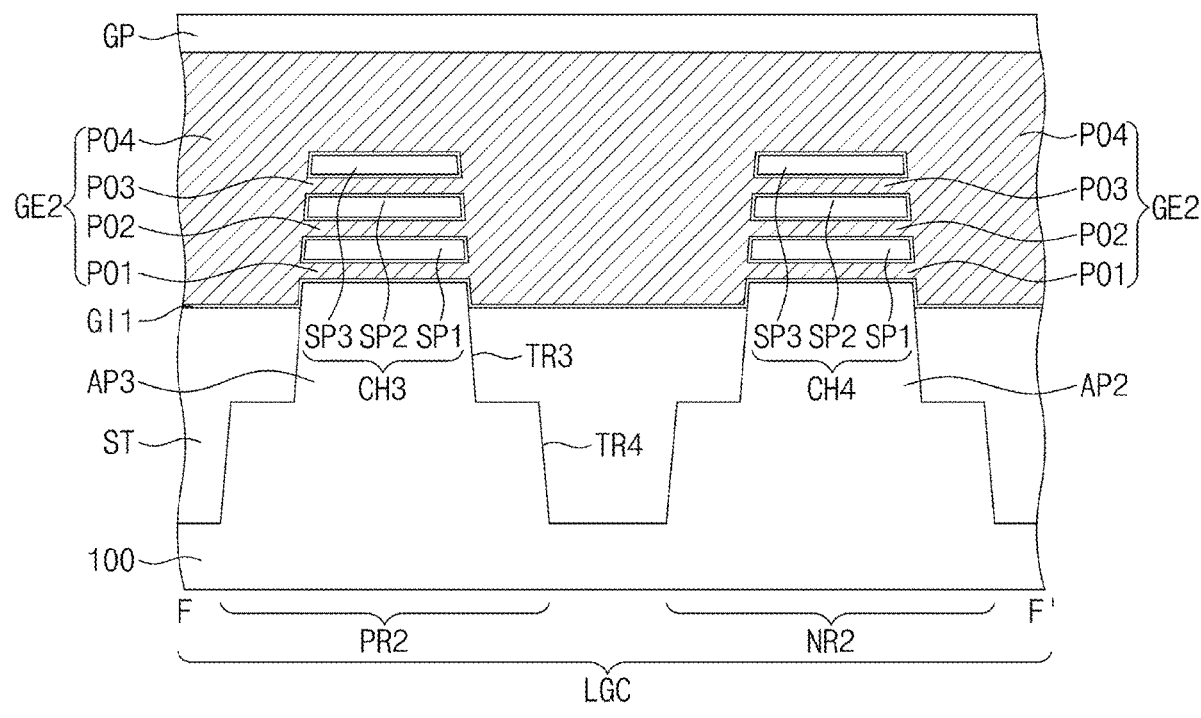

FIGS. 5, 7, 9, 11, and 13 illustrate plan views of stages in a method of fabricating a semiconductor device according to some example embodiments. FIGS. 6A, 8A, 10A, 12A, and 14A illustrate cross-sectional views taken along line A-A' of FIGS. 5, 7, 9, 11, and 13, respectively. FIGS. 6B, 8B, 10B, 12B, and 14B illustrate cross-sectional views taken along line B-B' of FIGS. 5, 7, 9, 11, and 13, respectively. FIGS. 6C, 8C, 10C, 12C, and 14C illustrate cross-sectional views taken along line C-C' of FIGS. 5, 7, 9, 11, and 13, respectively. FIGS. 6D, 8D, 10D, 12D, and 14D illustrate cross-sectional views taken along line D-D' of FIGS. 5, 7, 9, 11, and 13, respectively. FIGS. 10E, 12E, and 14E illustrate cross-sectional views taken along line E-E' of FIGS. 9, 11, and 13, respectively. FIGS. 10F, 12F, and 14F illustrate cross-sectional views taken along line F-F' of FIGS. 9, 11, and 13, respectively.

Referring to FIGS. 5 and 6A to 6D, a substrate 100 may be provided which includes a peripheral region PER and a logic cell region LGC. Semiconductor layers SL and sacrificial layers SAL may be formed alternately stacked on the substrate 100. The semiconductor layers SL may include silicon (Si), germanium (Ge), or silicon-germanium (SiGe), and the sacrificial layers SAL may include another of silicon (Si), germanium (Ge), or silicon-germanium (SiGe). In an implementation, the semiconductor layers SL may include silicon (Si), and the sacrificial layers SAL may include silicon-germanium (SiGe).

The substrate 100 may undergo a first patterning process to form a first trench TR1 that defines first, second, third, and fourth active patterns AP1, AP2, AP3, and AP4. The semiconductor layers SL and the sacrificial layers SAL may be patterned during the first patterning process. In an implementation, each of the first to fourth active patterns AP1 to AP4 may include the semiconductor layers SL and the sacrificial layers SAL that are alternately stacked on the substrate 100.

The substrate 100 may undergo a second patterning process to form a second trench TR2 that defines a first PMOSFET region PR1, a first NMOSFET region NR1, a second PMOSFET region PR2, and a second NMOSFET region NR2. The second trench TR2 may be formed deeper than the first trench TR1. In an implementation, it is possible to omit the second patterning process for forming the second trench TR2.

The first PMOSFET region PR1 and the first NMOSFET region NR1 may be on the peripheral region PER. A first active pattern AP1 and a second active pattern AP2 may be respectively formed on the first PMOSFET region PR1 and the first NMOSFET region NR1. The second PMOSFET region PR2 and the second NMOSFET region NR2 may be on the logic cell region LGC. A third active pattern AP3 and a fourth active pattern AP4 may be respectively formed on the second PMOSFET region PR2 and the second NMOSFET region NR2.

A device isolation layer ST may be formed on the substrate 100, filling the first and second trenches TR1 and TR2. The device isolation layer ST may include a dielectric material, such as a silicon oxide layer. The device isolation layer ST may be recessed until upper portions of the first to fourth active patterns AP1 to AP4 are exposed. Thus, the upper portions of the first and second active patterns AP1 and AP2 may vertically protrude upwards from the device isolation layer ST.

Referring to FIGS. 7 and 8A to 8D, on the peripheral region PER, a first sacrificial pattern PP1 may be formed to run across the first and second active patterns AP1 and AP2. On the logic cell region LGC, second sacrificial patterns PP2 may be formed to run across the third and fourth active patterns AP3 and AP4. The first sacrificial pattern PP1 and the second sacrificial patterns PP2 may be formed to have their linear or bar shapes that extend in a first direction D1.

The first sacrificial pattern PP1 may be formed to have a width greater than that of the second sacrificial pattern PP2.

In an implementation, the formation of the first and second sacrificial patterns PP1 and PP2 may include forming a sacrificial layer on an entire surface of the substrate 100, forming hardmask patterns MA on the sacrificial layer, and using the hardmask patterns MA as an etching mask to pattern the sacrificial layer. The sacrificial layer may include polysilicon.

In an implementation, the patterning process for forming the first and second sacrificial patterns PP1 and PP2 may include a lithography process in which an extreme ultraviolet (EUV) radiation is used. In this description, the EUV may mean an ultraviolet ray having a wavelength of about 4 nm to about 124 nm, e.g., about 4 nm to about 20 nm, or about 13.5 nm. The EUV may denote light whose energy is in the range of about 6.21 eV to about 124 eV, e.g., about 90 eV to about 95 eV.

The EUV lithography process may include exposure and development processes in which the EUV is irradiated onto a photoresist layer. In an implementation, the photoresist layer may be an organic photoresist that contains an organic polymer, e.g., polyhydroxystyrene. The organic photoresist may further include a photosensitive compound that is sensitive to the EUV. The organic photoresist may additionally include a material whose EUV absorption coefficient is high, e.g., an organometallic material, an iodine-containing material, or a fluorine-containing material. In an implementation, the photoresist layer may be an inorganic photoresist that contains an inorganic material, e.g., tin oxide.

The photoresist layer may be formed to have a relatively small thickness. The photoresist layer exposed to the EUV may be developed to form photoresist patterns. In an implementation, when viewed in plan, the photoresist patterns may have a linear shape that extends in one direction, an island shape, a zigzag shape, a honeycomb shape, or a circular shape.

The photoresist patterns may be used as an etching mask to pattern one or more mask layers that are stacked thereunder, and the hardmask patterns MP may be formed as discussed above. The hardmask patterns MP may be used as an etching mask to pattern a target layer or the sacrificial layer to form on a wafer a plurality of patterns or the first and second sacrificial patterns PP1 and PP2.

As a comparative example, a multi-patterning technique (MPT) may be required to use two or more photomasks so as to form fine-pitched patterns on a wafer. In contrast, when the EUV lithography process is performed according to an embodiment, even a single photomask may form the first and second sacrificial patterns PP1 and PP2 having fine pitches.

In an implementation, a distance equal to or less than about 45 nm may be given as a minimum pitch between the first and second sacrificial patterns PP1 and PP2 that are formed by the EUV lithography according to the present embodiment. The EUV lithography may be performed to form the first and second sacrificial patterns PP1 and PP2 that are sophisticated and fine, even without the multi-patterning process.

In an implementation, the EUV lithography process may be used to perform not only the patterning process for forming the first and second sacrificial patterns PP1 and PP2, but also the patterning process for forming the first to fourth active patterns AP1 to AP.

A pair of gate spacers GS may be formed on opposite sidewalls of each of the first and second sacrificial patterns PP1 and PP2. The formation of the gate spacers GS may include conformally forming a gate spacer layer on the entire surface of the substrate 100 and anisotropically etching the gate spacer layer. The gate spacer layer may include, e.g., SiCN, SiCON, or SiN. In an implementation, the gate spacer layer may be a multi-layer including at least two of SiCN, SiCON, and SiN.

Referring to FIGS. 9 and 10A to 10F, first to fourth source/drain patterns SD1 to SD4 may be respectively formed on the first to fourth active patterns AP1 to AP4. In an implementation, the first source/drain patterns SD1 may be formed on the upper portion of the first active pattern AP1. A pair of first source/drain patterns SD1 may be formed on opposite sides of the first sacrificial pattern PP1. For example, the hardmask patterns MA and the gate spacers GS may be used as an etching mask to etch the upper portion of the first active pattern AP1 to form first recesses RS1. During the etching of the upper portion of the first active pattern AP1, the device isolation layer ST may be recessed between the first active patterns AP1 (see FIG. 10C).

The first source/drain pattern SD1 may be formed by performing a selective epitaxial growth process in which an inner wall of the first recess RS1 of the first active pattern AP1 is used as a seed layer. The formation of the first source/drain patterns SD1 may define a first channel pattern CH1 that includes first, second, and third semiconductor patterns SP1, SP2, and SP3 between the pair of first source/drain patterns SD1. In an implementation, the selective epitaxial growth process may include a chemical vapor deposition (CVD) process or a molecular beam epitaxy (MBE) process. The first source/drain patterns SD1 may include a semiconductor element (e.g., SiGe) whose lattice constant is greater than that of a semiconductor element of the substrate 100. Each of the first source/drain patterns SD1 may be formed of a plurality of semiconductor layers.

In an implementation, impurities may be in-situ implanted during the selective epitaxial growth process for the formation of the first source/drain patterns SD1. In an implementation, after the first source/drain patterns SD1 are formed, impurities may be implanted into the first source/drain patterns SD1. The first source/drain patterns SD1 may be doped to have a first conductivity type (e.g., p-type).

The second source/drain patterns SD2 may be formed on the upper portion of the second active pattern AP2. A pair of second source/drain patterns SD2 may be formed on opposite sides of the first sacrificial pattern PP1. The formation of the second source/drain patterns SD2 may define a second channel pattern CH2 that includes first, second, and third semiconductor patterns SP1, SP2, and SP3 between the pair of second source/drain patterns SD2.

In an implementation, the hardmask patterns MA and the gate spacers GS may be used as an etching mask to etch the upper portion of the second active pattern AP2 to form second recesses RS2. The second source/drain pattern SD2 may be formed by performing a selective epitaxial growth process in which an inner wall of the second recess RS2 on the second active pattern AP2 is adopted as a seed layer. In an implementation, the second source/drain patterns SD2 may include the same semiconductor element (e.g., Si) as that of the substrate 100. The second source/drain patterns SD2 may be doped to have a second conductivity type (e.g., n-type).

Before the formation of the second source/drain patterns SD2, the sacrificial layers SAL may be partially removed, which are exposed to the second recess RS2. A dielectric material may fill areas where the sacrificial layers SAL are partially removed, thereby forming an inner spacer IP.

The formation of the third source/drain patterns SD3 on the upper portion of the third active pattern AP3 may be substantially the same as the formation of the first source/drain patterns SD1 discussed above. The first source/drain patterns SD1 and the third source/drain patterns SD3 may be formed at the same time. The formation of the third source/drain patterns SD3 may define a third channel pattern CH3 that includes first, second, and third semiconductor patterns SP1, SP2, and SP3 between a pair of third semiconductor patterns SD3.

The formation of the fourth source/drain patterns SD4 on an upper portion of the fourth active pattern AP4 may be substantially the same as the formation of the second source/drain patterns SD2 discussed above. The second source/drain patterns SD2 and the fourth source/drain patterns SD4 may be formed at the same time. The formation of the fourth source/drain patterns SD4 may define a fourth channel pattern CH4 that includes first, second, and third semiconductor patterns SP1, SP2, and SP3 between a pair of fourth source/drain patterns SD4. Before the formation of the fourth source/drain patterns SD4, an inner spacer IP may be formed.

Referring to FIGS. 11 and 12A to 12F, a first interlayer dielectric layer 110 may be formed to cover the first to fourth source/drain patterns SD1 to SD4, the hardmask patterns MP, and the gate spacers GS. In an implementation, the first interlayer dielectric layer 110 may include a silicon oxide layer.

The first interlayer dielectric layer 110 may be planarized until top surfaces of the first and second sacrificial patterns PP1 and PP2 are exposed. An etch-back or chemical mechanical polishing (CMP) process may be employed to planarize the first interlayer dielectric layer 110. The hardmask patterns MA may all be removed during the planarization process. As a result, the first interlayer dielectric layer 110 may have a top surface coplanar with those of the first and second sacrificial patterns PP1 and PP2 and those of the gate spacers GS.

The first and second sacrificial patterns PP1 and PP2 may be selectively removed. The removal of the first sacrificial pattern PP1 may form a first empty space ET1 that exposes the first and second active patterns AP1 and AP2 (see FIG. 12C). The removal of the second sacrificial patterns PP2 may form second empty spaces ET2 that expose the third and fourth active patterns AP3 and AP4 (see FIG. 12F).

On the peripheral region PER, the sacrificial layers SAL exposed to the first empty space ET1 may be selectively removed. In an implementation, referring back to FIG. 12C, the sacrificial layers SAL may be selectively removed by performing an etching process in which the sacrificial layers SAL are selectively removed through the first empty space ET1. Any of the first, second, and third semiconductor patterns SP1, SP2, and SP3 may remain without being removed. The removal of the sacrificial layers SAL may form third empty spaces ET3. Each of the third empty spaces ET3 may be defined between neighboring ones of the first, second, and third semiconductor patterns SP1, SP2, and SP3.

On the logic cell region LGC, the sacrificial layers SAL exposed to the second empty space ET2 may be selectively removed. In an implementation, referring back to FIG. 12F, the sacrificial layers SAL may be selectively removed by performing an etching process in which the sacrificial layers SAL are selectively removed through the second empty space ET2. Any of the first, second, and third semiconductor patterns SP1, SP2, and SP3 may remain without being removed. The removal of the sacrificial layers SAL may form fourth empty spaces ET4. Each of the fourth empty spaces ET4 may be defined between neighboring ones of the first, second, and third semiconductor patterns SP1, SP2, and SP3.

Figure 12A:
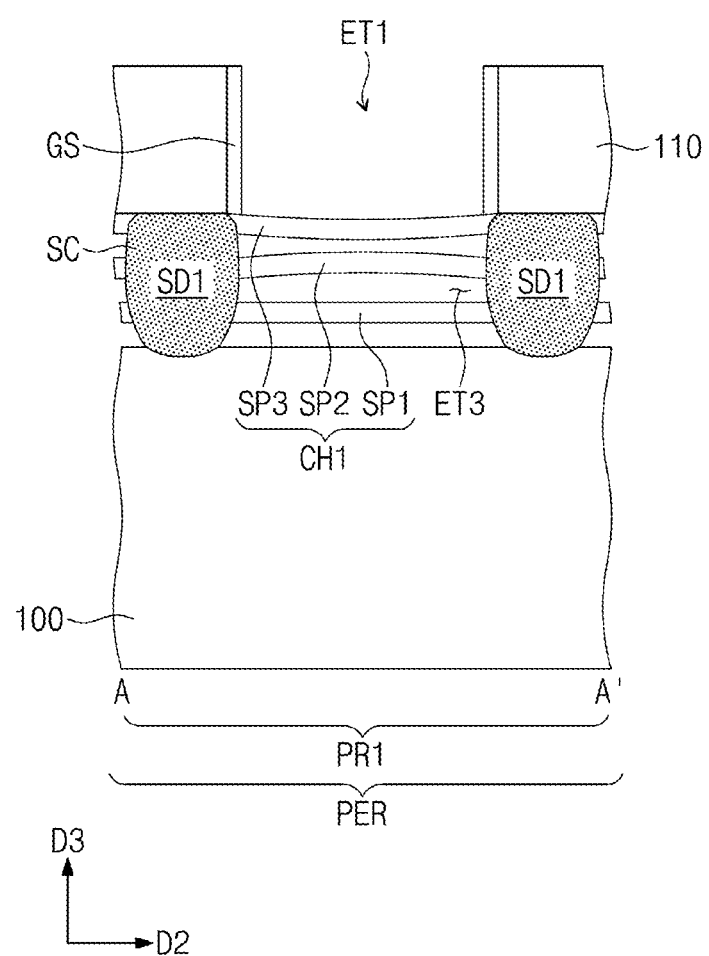
Figure 12B:
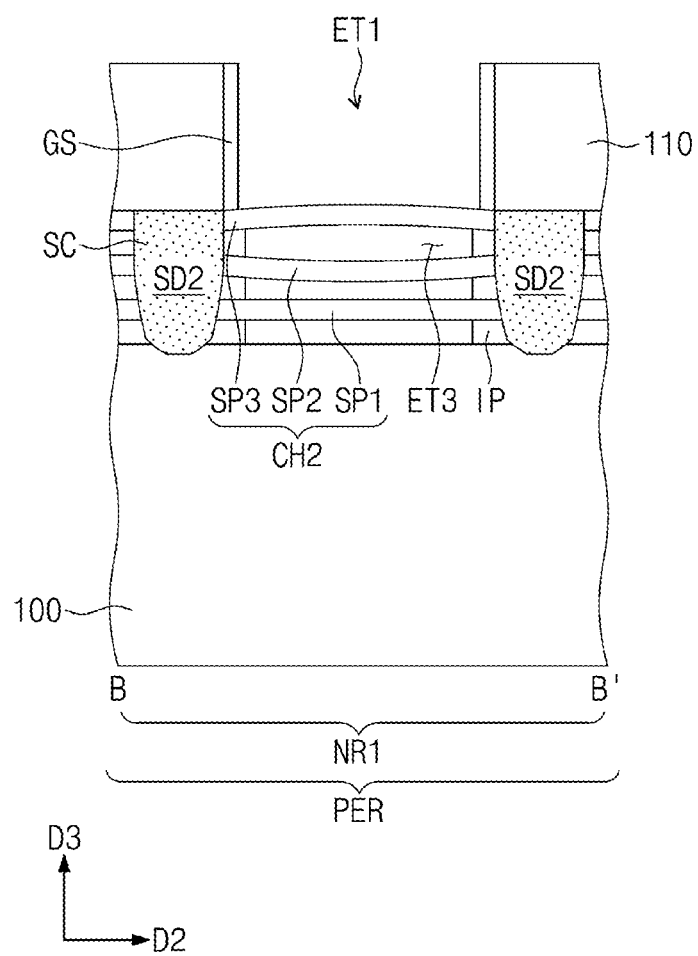
Figure 12C:
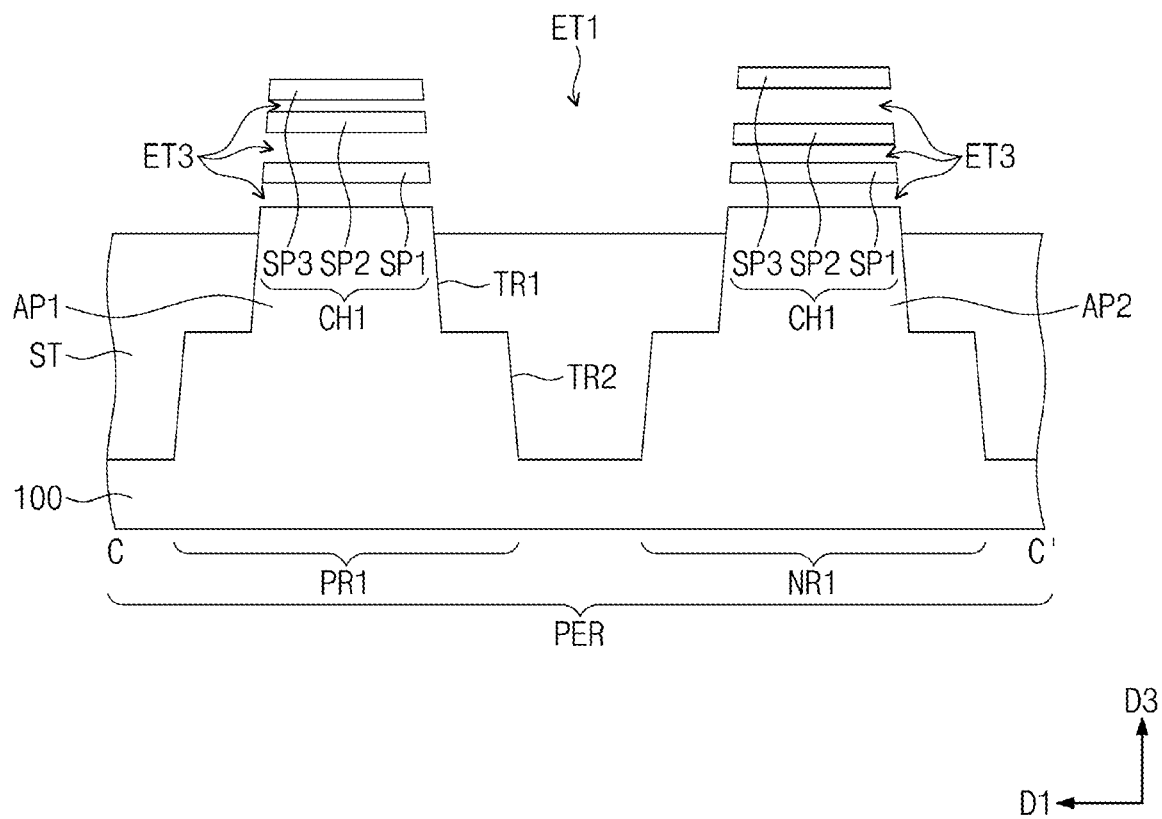
Figure 12D:
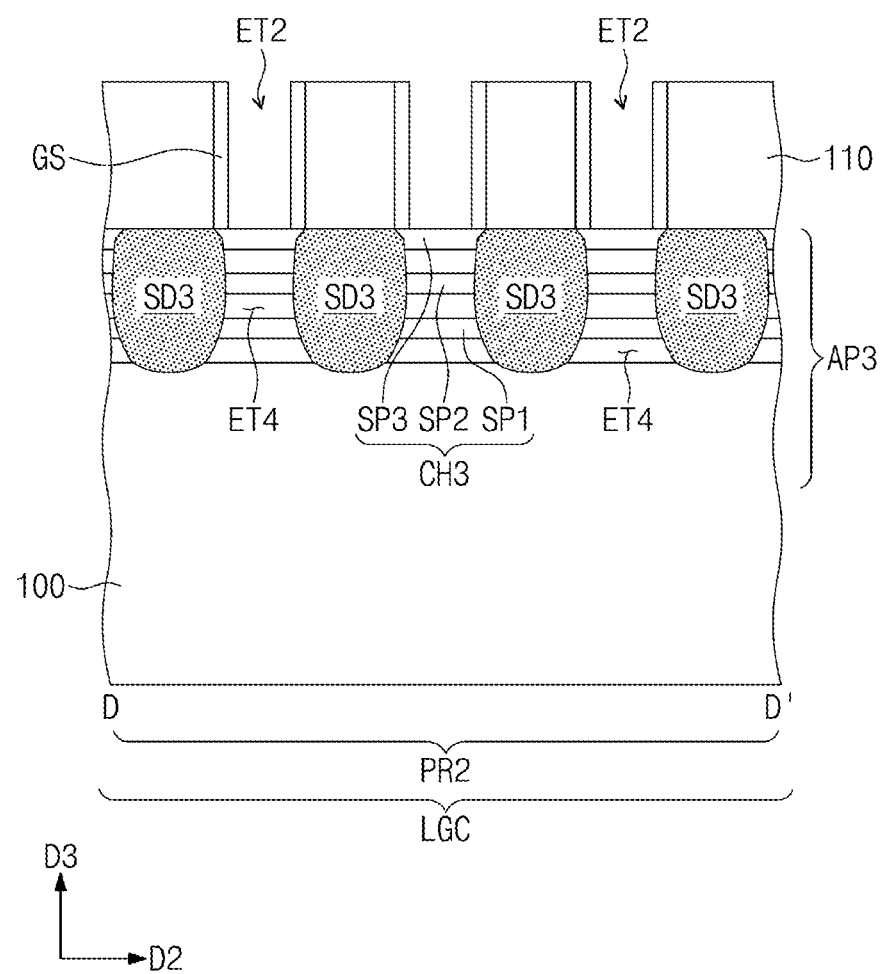
Figure 12E:
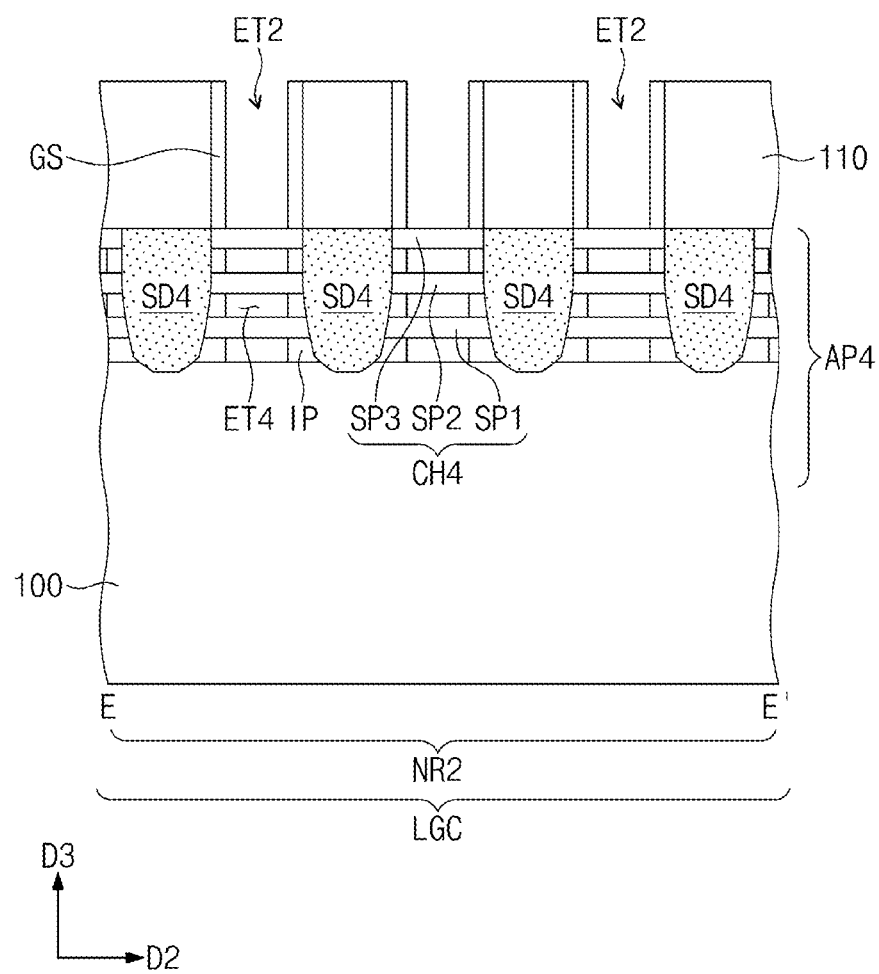
Figure 12F:
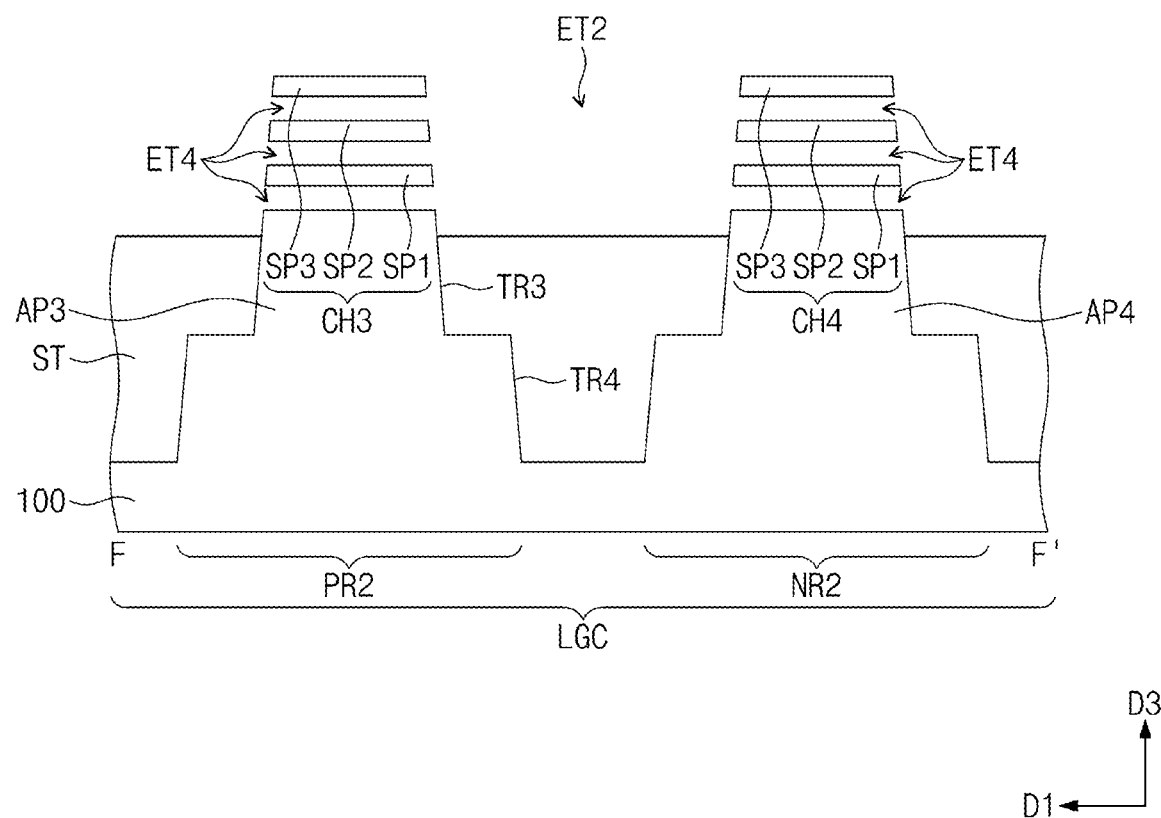
Figure 13:
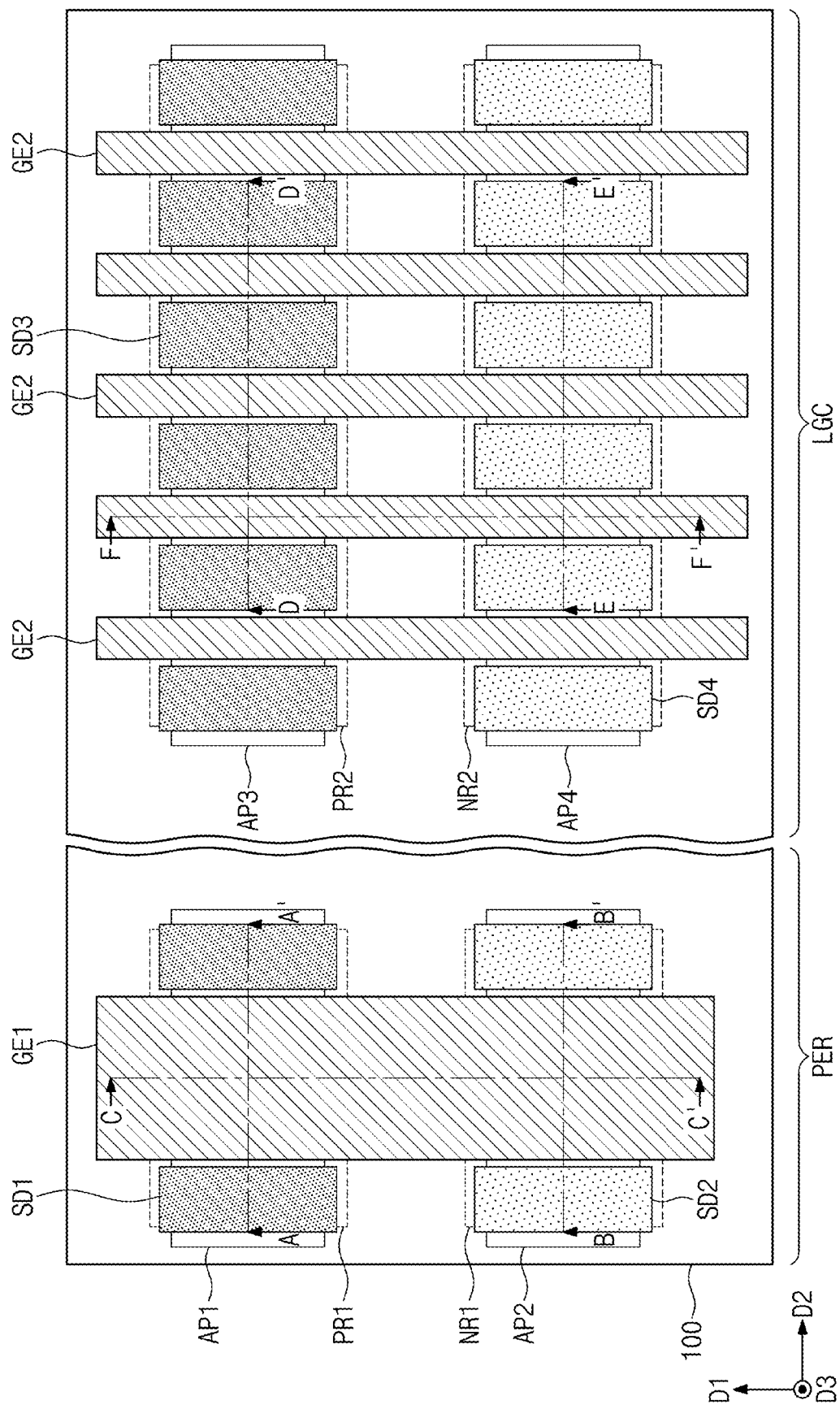

The removal of the sacrificial layers SAL from the peripheral region PER may bend the first, second, and third semiconductor patterns SP1, SP2, and SP3 that connect the pair of first source/drain patterns SD1 to each other (see FIG. 12A). The removal of the sacrificial layers SAL from the peripheral region PER may bend the first, second, and third semiconductor patterns SP1, SP2, and SP3 that connect the pair of second source/drain patterns SD2 to each other (see FIG. 12B). At least one of the first, second, and third semiconductor patterns SP1, SP2, and SP3 may be bent in the third direction D3 or in a direction opposite to the third direction D3.

The first, second, and third semiconductor patterns SP1, SP2, and SP3 may have lengths that are greater on the peripheral region PER than on the logic cell region LGC, and this difference in length may cause the bending of at least one selected from the first, second, and third semiconductor patterns SP1, SP2, and SP3 on the peripheral region PER. The bending of at least one of the first to third semiconductor patterns SP1 to SP3 may be easily achieved due to the removal of the sacrificial layers SAL that physically support the first to third semiconductor patterns SP1 to SP3. For example, the first source/drain patterns SD1 may provide the first channel pattern CH1 with compressive stress, and thus the second and third semiconductor patterns SP2 and SP3 may be bent toward each other.

Referring to FIGS. 13 and 14A to 14F, first and second gate dielectric layers GI1 and GI2 may be formed respectively in the first and second empty spaces ET1 and ET2. The first gate dielectric layer GI1 may be formed in the third empty space ET3, and may surround the first, second, and third semiconductor patterns SP1, SP2, and SP3. The second gate dielectric layer GI2 may be formed in the fourth empty space ET4, and may surround the first, second, and third semiconductor patterns SP1, SP2, and SP3.

First and second gate electrodes GE1 and GE2 may be formed respectively in the first and second empty spaces ET1 and ET2. The first gate electrode GE1 may include first, second, and third parts P01, P02, and P03 that fill the third empty space ET3, and may further include a fourth part P04 that fills the first empty space ET1. The second gate electrode GE2 may include first, second, and third parts P01, P02, and P03 that fill the fourth empty space ET4, and may further include a fourth part P04 that fills the second empty space ET2. A gate capping pattern GP may be formed on each of the first and second gate electrodes GE1 and GE2.

Referring back to FIGS. 1 and 2A to 2H, a second interlayer dielectric layer 120 may be formed on the first interlayer dielectric layer 110. The second interlayer dielectric layer 120 may include a silicon oxide layer. Active contacts AC may be formed to penetrate the second and first interlayer dielectric layers 120 and 110 and to have electrical connection with the first, second, third, and fourth source/drain patterns SD1, SD2, SD3, and SD4. Gate contacts GC may be formed to penetrate the second and first interlayer dielectric layers 120 and 110 and to have electrical connection with the first and second gate electrodes GE1 and GE2.

A third interlayer dielectric layer 130 may be formed on the second interlayer dielectric layer 120. A first metal layer M1 may be formed in the third interlayer dielectric layer 130. The formation of the first metal layer M1 may include forming first lines IL1. A fourth interlayer dielectric layer 140 may be formed on the first metal layer M1. A second metal layer M2 may be formed in the fourth interlayer dielectric layer 140. The formation of the second metal layer M2 may include forming second lines IL2.

In an implementation, an EUV lithography process may be used to form the first lines IL1 and/or the second lines IL2 in the first metal layer M1 and/or the second metal layer M2. A detailed description of the EUV lithography process used in BEOL processes may be substantially the same as that for forming the first and second sacrificial patterns PP1 and PP2. In an implementation, a distance equal to or less than about 45 nm may be given as a minimum pitch between the first lines IL1 formed by the EUV lithography process.

Figure 15:
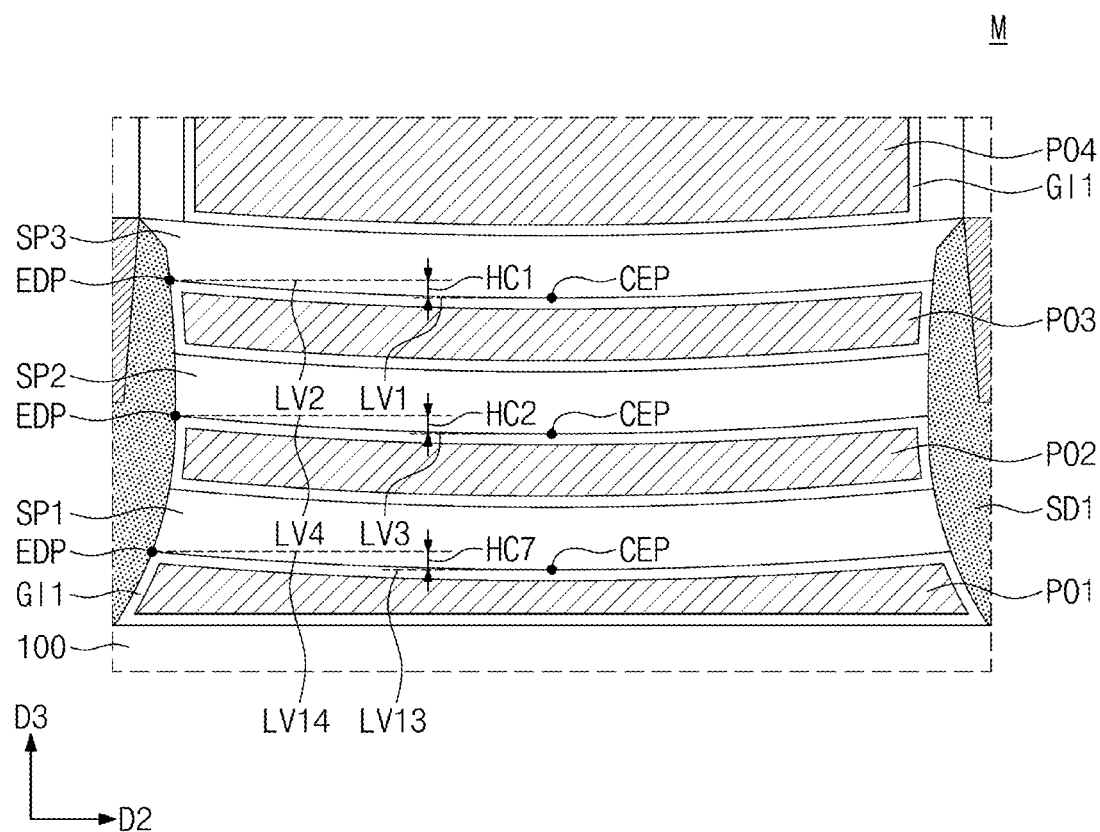
FIGS. 15 and 16 illustrate enlarged cross-sectional views of section M of FIG. 2A, showing a semiconductor device according to some example embodiments.
Figure 16:
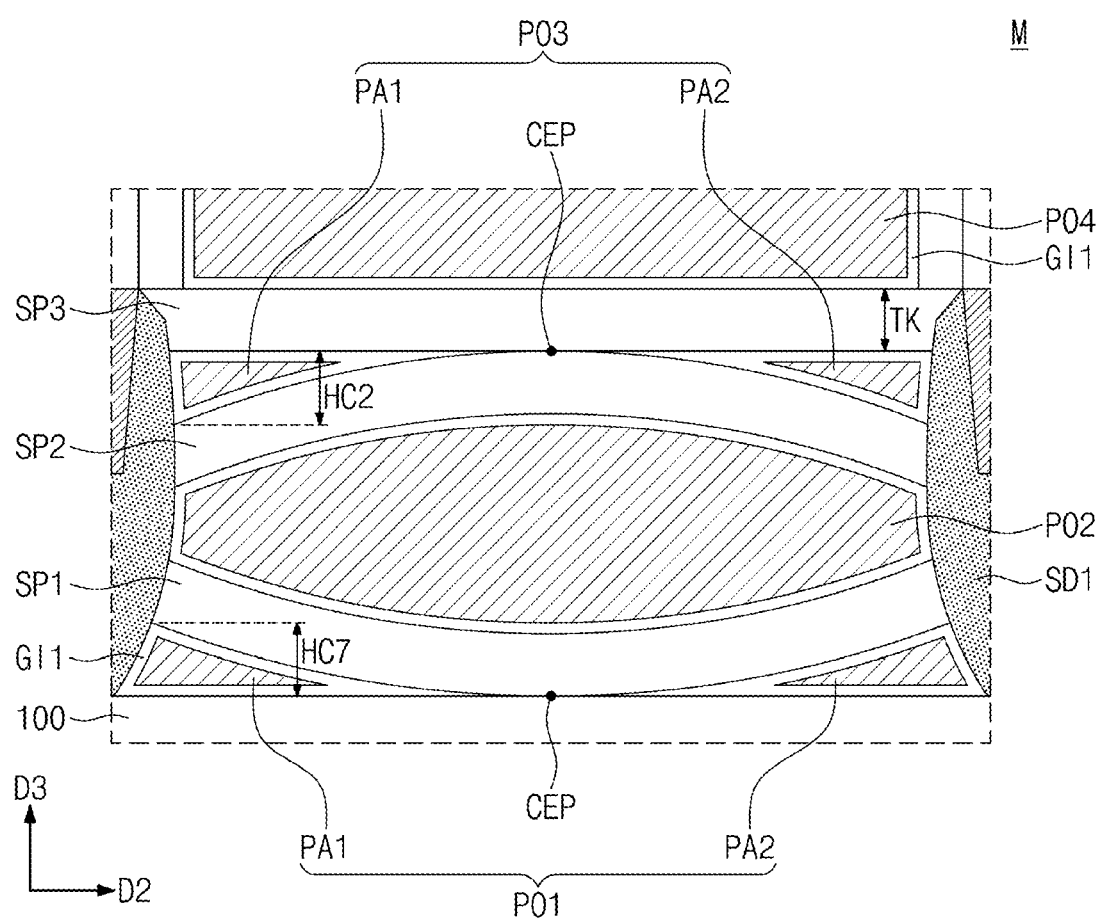

FIGS. 15 and 16 illustrate enlarged cross-sectional views of section M of FIG. 2A, showing a semiconductor device according to some example embodiments. In the embodiment that follows, a detailed description of technical features repetitive to those discussed with reference to FIGS. 1 to 4 may be omitted, and a difference thereof may be discussed in detail.

Referring to FIG. 15, the first, second, and third semiconductor patterns SP1, SP2, and SP3 may all be bent. In an implementation, the first, second, and third semiconductor patterns SP1, SP2, and SP3 may all be bent in the same direction. In an implementation, the first, second, and third semiconductor patterns SP1, SP2, and SP3 may be bent in different directions. The first height difference HC1 of the third semiconductor pattern SP3 may have a negative value. The second height difference HC2 of the second semiconductor pattern SP2 may have a negative value.

In an implementation, the first semiconductor pattern SP1 may be bent in a direction opposite to the third direction D3. The first semiconductor pattern SP1 may be bent toward the substrate 100. The first semiconductor pattern SP1 may have one or both of a curved bottom surface and a curved top surface. A seventh height difference HC7 may indicate the degree of bending of the first semiconductor pattern SP1. The center point CEP at the bottom surface of the first semiconductor pattern SP1 may be at a thirteenth level LV13, and the edge point EDP at the bottom surface of the first semiconductor pattern SP1 may be at a fourteenth level LV14. The seventh height difference HC7 may be a difference between the thirteenth level LV13 and the fourteenth level LV14, or LV13-LV14. The thirteenth level LV13 may be lower than the fourteenth level LV14, and the seventh height difference HC7 may have a negative value.

Referring to FIG. 16, the second semiconductor pattern SP2 may be largely bent in the third direction D3. At least a portion of the top surface of the second semiconductor pattern SP2 may be in contact with the bottom surface of the third semiconductor pattern SP3. In an implementation, the center point CEP at the top surface of the second semiconductor pattern SP2 may be in contact with the bottom surface of the third semiconductor pattern SP3. The second height difference HC2 of the second semiconductor pattern SP2 may be about 1 to 2 times the thickness TK of the semiconductor pattern SP1, SP2, or SP3.

The first semiconductor pattern SP1 may be largely bent in a direction opposite to the third direction D3. At least a portion of the bottom surface of the first semiconductor pattern SP1 may be in contact with the top surface of the substrate 100. In an implementation, the center point CEP at the bottom surface of the first semiconductor pattern SP1 may be in contact with the bottom surface of the substrate 100. The seventh height difference HC7 of the first semiconductor pattern SP1 may be about 1 to 2 times the thickness TK of the semiconductor pattern SP1, SP2, or SP3.

In an implementation, the first semiconductor pattern SP1 may be in contact with the substrate 100, and the first part P01 of the first gate electrode GE1 may be divided into a first segment PA1 and a second segment PA2. In an implementation, the first gate electrode GE1 may not fill at least a portion of an area between the first semiconductor pattern SP1 and the substrate 100.

In an implementation, the second semiconductor pattern SP2 may be in contact with the third semiconductor pattern SP3, and the third part P03 of the first gate electrode GE1 may be divided into a first segment PA1 and a second segment PA2. In an implementation, the first gate electrode GE1 may not fill at least a portion of an area between the second semiconductor pattern SP2 and the third semiconductor pattern SP3. The second part P02 of the first gate electrode GE1 may have a volume greater than that of any of the first and third parts P01 and P03 of the first gate electrode GE1.

By way of summation and review, a scale down of MOSFETs may deteriorate operating characteristics of the semiconductor device. Accordingly, methods of fabricating semiconductor devices having superior performances while overcoming limitations caused by high integration of the semiconductor devices have been considered.

In a semiconductor device according to an embodiment, each of semiconductor patterns that constitute a channel may be adjusted to its direction and degree of bending. Thus, even when transistors have the same size, the transistors may be adjusted to have driving forces that are different from each other due to a variation in physical structure of semiconductor patterns. A semiconductor device according to an embodiment may have increased reliability and excellent electrical characteristics.

One or more embodiments may provide a semiconductor device including a field effect transistor.

One or more embodiments may provide a semiconductor device of which electrical characteristics are improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate that includes a first region and a second region;
a first active pattern on the first region, the first active pattern including a pair of first source/drain patterns and a first channel pattern between the pair of first source/drain patterns;
a second active pattern on the second region, the second active pattern including a pair of second source/drain patterns and a second channel pattern between the pair of second source/drain patterns; and
a first gate electrode on the first channel pattern and a second gate electrode on the second channel pattern,
wherein:
a length of the first channel pattern is greater than a length of the second channel pattern,
each of the first channel pattern and the second channel pattern includes a plurality of semiconductor patterns stacked on the substrate, and
at least two semiconductor patterns of the plurality of semiconductor patterns of the first channel pattern are bent with a curved shape in a first vertical direction away from a bottom surface of the substrate or bent with a curved shape in a second vertical direction toward the bottom surface of the substrate.

2. The semiconductor device as claimed in claim 1, wherein:
the at least two semiconductor patterns include a first semiconductor pattern and a second semiconductor pattern,
a first height difference is defined between a center point at a bottom surface of the first semiconductor pattern and an edge point at the bottom surface of the first semiconductor pattern,
a second height difference is defined between a center point at a bottom surface of the second semiconductor pattern and an edge point at the bottom surface of the second semiconductor pattern,
a ratio of the first height difference to a thickness of the first semiconductor pattern is about 0.1 to about 2, and
a ratio of the second height difference to a thickness of the second semiconductor pattern is about 0.1 to about 2.

3. The semiconductor device as claimed in claim 2, wherein:
one of the first height difference and the second height difference has a positive value, and
another of the first height difference and the second height difference has a negative value.

4. The semiconductor device as claimed in claim 2, wherein both of the first height difference and the second height difference have a positive value.

5. The semiconductor device as claimed in claim 2, wherein both of the first height difference and the second height difference have a negative value.

6. The semiconductor device as claimed in claim 2, wherein:
the first gate electrode includes a part between the first semiconductor pattern and the second semiconductor pattern, and
a thickness of the part increases from the center point of the first semiconductor pattern to the edge point of the first semiconductor pattern.

7. The semiconductor device as claimed in claim 2, wherein:
the first gate electrode includes a part between the first semiconductor pattern and the second semiconductor pattern, and
a thickness of the part decreases from the center point of the first semiconductor pattern to the edge point of the first semiconductor pattern.

8. The semiconductor device as claimed in claim 1, wherein at least one of the plurality of semiconductor patterns of the first channel pattern is flat.

9. The semiconductor device as claimed in claim 1, wherein the plurality of semiconductor patterns of the second channel pattern are flat.

10. The semiconductor device as claimed in claim 1, wherein:
the first region is a peripheral region, and
the second region is a logic cell region.

11. A semiconductor device, comprising:
a substrate that includes a first region and a second region;

a first active pattern on the first region, the first active pattern including a pair of first source/drain patterns and a first channel pattern between the pair of first source/drain patterns;

a second active pattern on the second region, the second active pattern including a pair of second source/drain patterns and a second channel pattern between the pair of second source/drain patterns; and a first gate electrode on the first channel pattern and a second gate electrode on the second channel pattern, wherein:

a length of the first channel pattern is greater than a length of the second channel pattern, the first channel pattern includes a first semiconductor pattern, a second semiconductor pattern, and a third semiconductor pattern sequentially stacked on the substrate, the first gate electrode includes:

a first part between the substrate and the first semiconductor pattern;

a second part between the first semiconductor pattern and the second semiconductor pattern; and a third part between the second semiconductor pattern and the third semiconductor pattern, a thickness of one of the second part and the third part decreases from a center point thereof to an edge point thereof, and a thickness of another of the second part and the third part increases from a center point thereof to an edge point thereof.

12. The semiconductor device as claimed in claim 11, wherein the thickness of the first part is substantially constant from a center point thereof to an edge point thereof.

13. The semiconductor device as claimed in claim 11, wherein:

at least a portion of a top surface of the second semiconductor pattern is in contact with a bottom surface of the third semiconductor pattern, and the third part includes a first segment and a second segment.

14. The semiconductor device as claimed in claim 11, wherein:

the second semiconductor pattern and the third semiconductor pattern are bent toward each other, and the thickness of the third part increases from the center point thereof to the edge point thereof.

15. The semiconductor device as claimed in claim 11, wherein:

the second semiconductor pattern and the third semiconductor pattern are bent away from each other, and the thickness of the third part decreases from the center point thereof to the edge point thereof.

16. A semiconductor device, comprising:

a substrate that includes a peripheral region and a logic cell region;

a device isolation layer that defines a first active pattern on the peripheral region and a second active pattern on the logic cell region;

a pair of first source/drain patterns on the first active pattern and a pair of second source/drain patterns on the second active pattern;

a first channel pattern between the pair of first source/drain patterns and a second channel pattern between the pair of second source/drain patterns, each of the first channel pattern and the second channel pattern including a first semiconductor pattern, a second semiconductor pattern, and a third semiconductor pattern sequentially stacked on the substrate;

a first gate electrode on the first channel pattern and a second gate electrode on the second channel pattern;

a first gate dielectric layer between the first channel pattern and the first gate electrode and a second gate dielectric layer between the second channel pattern and the second gate electrode;

a pair of gate spacers on opposite sides of each of the first gate electrode and the second gate electrode;

a gate capping pattern on a top surface of each of the first gate electrode and the second gate electrode;

a plurality of active contacts electrically connected to the first source/drain pattern and the second source/drain pattern;

a plurality of gate contacts electrically connected to the first gate electrode and the second gate electrode;

a first metal layer on the active contacts and the gate contacts, the first metal layer including a plurality of first lines electrically connected to the active contacts and the gate contacts; and a second metal layer on the first metal layer, wherein:

a length of the first channel pattern is greater than a length of the second channel pattern, at least two of the first semiconductor pattern, the second semiconductor pattern, and the third semiconductor pattern of the first channel pattern are bent in a first vertical direction away from a bottom surface of the substrate or bent in a second vertical direction toward the bottom surface of the substrate, and a remaining one of the first semiconductor pattern, the second semiconductor pattern, and the third semiconductor pattern of the first channel pattern is flat.

17. The semiconductor device as claimed in claim 16, wherein the first semiconductor pattern, the second semiconductor pattern, and the third semiconductor pattern of the second channel pattern are flat.

18. The semiconductor device as claimed in claim 16, wherein:

the first gate electrode includes a part between the at least two of the first semiconductor pattern, the second semiconductor pattern, and the third semiconductor pattern, and a thickness of the part decreases from a center point thereof to an edge point thereof.

19. The semiconductor device as claimed in claim 16, wherein:

the first gate electrode includes a part between the at least two of the first semiconductor pattern, the second semiconductor pattern, and the third semiconductor pattern, and a thickness of the part increases from a center point thereof to an edge point thereof.

* * * * *